(12) United States Patent
Yamada et al.

(10) Patent No.: US 8,047,803 B2
(45) Date of Patent: Nov. 1, 2011

(54) FAN APPARATUS

(75) Inventors: Suguru Yamada, Kyoto (JP); Hironobu Nishida, Kyoto (JP); Tomo Hayashigaito, Kyoto (JP); Kenji Iwamoto, Kyoto (JP)

(73) Assignee: Nidec Corporation, Kyoto (JP)

( * ) Notice: Subject to any disclaimer, the term of this patent is extended or adjusted under 35 U.S.C. 154(b) by 757 days.

(21) Appl. No.: 12/186,041

(22) Filed: Aug. 5, 2008

(65) Prior Publication Data

US 2009/0040714 A1  Feb. 12, 2009

(30) Foreign Application Priority Data

Aug. 10, 2007 (JP) ................................ 2007-208881

(51) Int. Cl.
 *F04D 29/38* (2006.01)
 *H05K 7/20* (2006.01)

(52) U.S. Cl. ........................ 416/238; 361/695
(58) Field of Classification Search ............... 361/679.4, 361/690, 695; 416/196, 238; 415/115
 See application file for complete search history.

(56) References Cited

U.S. PATENT DOCUMENTS

| | | | |
|---|---|---|---|
| 5,546,272 A * | 8/1996 | Moss et al. ............... | 361/679.48 |
| 6,920,049 B2 | 7/2005 | Brooks et al. | |
| 7,548,421 B2 * | 6/2009 | Malone et al. ................ | 361/695 |
| 2006/0023419 A1 * | 2/2006 | Kao et al. ...................... | 361/690 |
| 2006/0237453 A1 * | 10/2006 | Yu et al. ........................ | 219/757 |
| 2007/0081888 A1 * | 4/2007 | Harrison ........................ | 415/47 |
| 2007/0091565 A1 | 4/2007 | Malone et al. | |
| 2007/0091566 A1 | 4/2007 | Sun | |
| 2008/0260517 A1 * | 10/2008 | Hayashigaito et al. ......... | 415/68 |

FOREIGN PATENT DOCUMENTS

| | | |
|---|---|---|
| CN | 1955879 A | 5/2007 |
| JP | 2006-301763 A | 11/2006 |
| JP | 2007-247501 A | 9/2007 |
| JP | 4033843 B2 | 1/2008 |

OTHER PUBLICATIONS

Hayashigaito et al.: "Fan Apparatus," U.S. Appl. No. 12/103,918, filed Apr. 16, 2008.

* cited by examiner

*Primary Examiner* — Calvin Lee
(74) *Attorney, Agent, or Firm* — Keating & Bennett, LLP

(57) ABSTRACT

A fan apparatus includes a fan section having a hollow housing with an inlet and an outlet, and a hollow duct section disposed on the outlet side of the fan section. The housing and the duct section are coupled by a coupling member.

19 Claims, 22 Drawing Sheets

FAN APPARATUS

BACKGROUND OF THE INVENTION

1. Field of the Invention

The present invention relates to a fan apparatus.

2. Description of the Related Art

A server computer has a function of transmitting information to client computers. Such server computers may include a rack-mount server and a blade server, for example.

Generally, a blade server is provided with a plurality of plate-like blades, an enclosure, and a rack. Each blade includes an MPU (Micro Processing Unit), memories, and the like mounted thereon. The blades are accommodated in the enclosure using a high density arrangement, and are attached to the rack for storage together with the enclosure. In general, a power supply for supplying a current to the blade server and a cooling device for cooling the blade server are shared by a plurality of blades disposed in one enclosure.

As described above, the cooling device is disposed in the inside of the enclosure. In the enclosure, a plurality of blades are disposed in a high density arrangement. For this reason, heat generated by the electronic components (e.g., MPU, memories, and the like) disposed in the respective blades is undesirably likely to stay inside the enclosure. Therefore, it is necessary for the cooling device disposed in the enclosure to efficiently cool the electronic components and the ventilate the inside of the enclosure.

In general, a fan is used as the cooling device. In addition, a duct is attached to the fan. The duct is used for guiding the airflow generated by the fan to an arbitrary position in the enclosure. However, due to the coupling structure of the duct and the fan, the shape of the air channel portion, the flow path area, and the like, between the fan and the duct are varied. Such variations affect certain characteristics such as the air quantity and the static pressure of the airflow generated by the fan. Accordingly, it is necessary to ensure that the coupling structure of the fan and the duct do not interfere with fan characteristics such as the air quantity and the static pressure of the airflow.

SUMMARY OF THE INVENTION

In order to overcome the problems described above, a fan apparatus according to a preferred embodiment of the present invention includes a fan section having a hollow housing member with an inlet and an outlet, and a hollow duct section disposed on the outlet side of the fan section. The housing of the fan section and the duct section are preferably coupled through a coupling member. Accordingly, the fan section and the duct section are firmly coupled and fixed together.

Other features, elements, advantages and characteristics of the present invention will become more apparent from the following detailed description of preferred embodiments thereof with reference to the attached drawings.

DETAILED DESCRIPTION OF PREFERRED EMBODIMENTS

Figure 1:
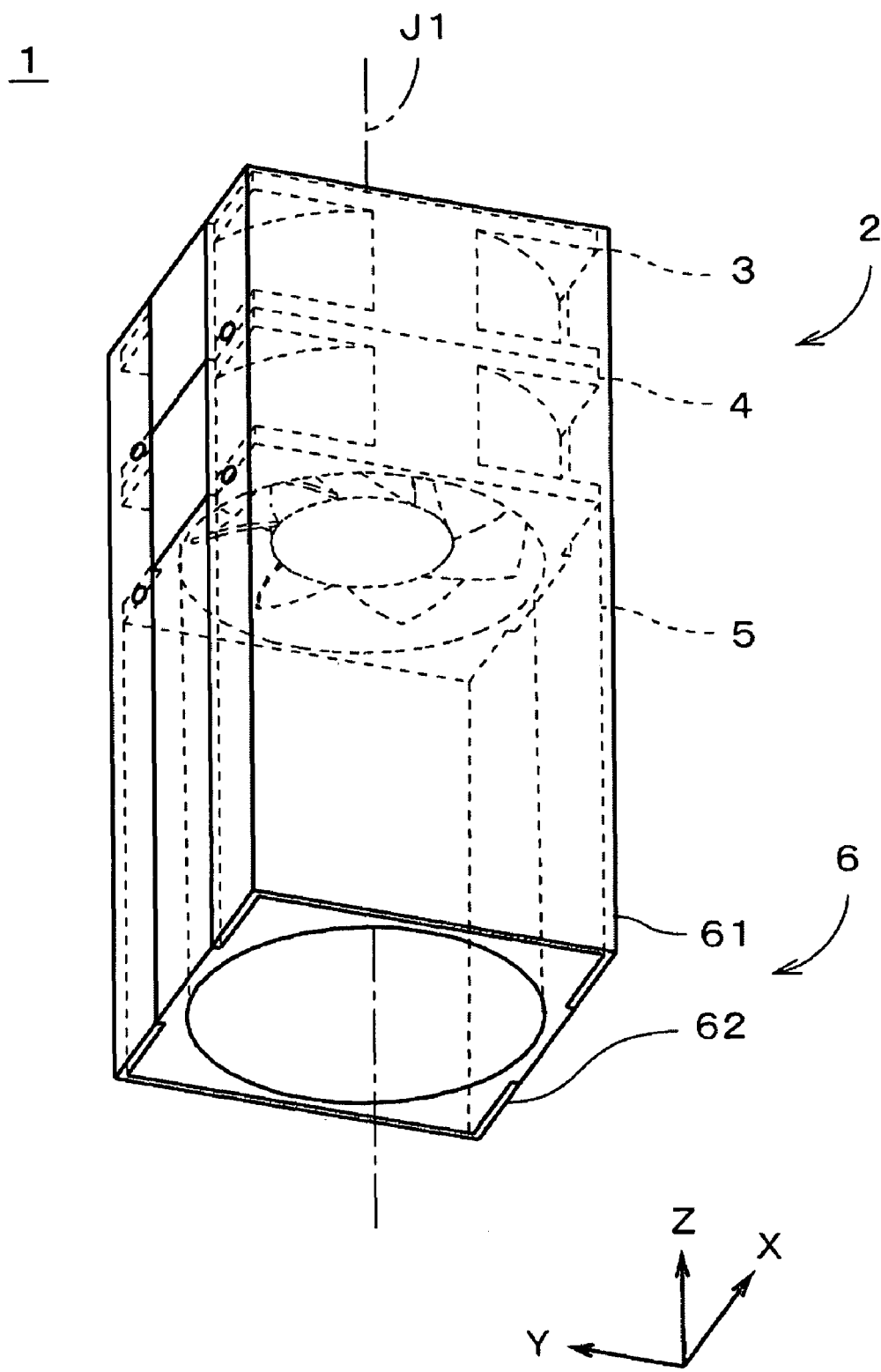
FIG. 1 is a perspective view of a fan apparatus of a first preferred embodiment of the present invention.

Referring to FIGS. 1 through 22, preferred embodiments of the present invention will be described in detail. It should be noted that in the explanation of the preferred embodiments of the present invention, when positional relationships among and orientations of the different components are described as being up/down or left/right, ultimately positional relationships and orientations that are in the drawings are indicated, positional relationships among and orientations of the components once having been assembled into an actual device are not indicated. In the following description, an axial direction indicates a direction substantially parallel to a rotation axis, and a radial direction indicates a direction substantially perpendicular to the rotation axis.

FIG. 1 is a perspective view of a fan apparatus 1 of the first preferred embodiment of the present invention. In FIG. 1, the inner structure of the fan apparatus 1 is depicted by dashed lines.

The fan apparatus 1 includes an axial fan section 2, a duct section 5, and a coupling section 6. The fan apparatus 1 is used for ventilating the inside of a server computer, or for cooling electronic components mounted on the server computer, for example.

In the present preferred embodiment, the fan apparatus 1 takes in air from the upper side of FIG. 1, and exhausts air to the lower side of FIG. 1. In the following description, in the fan apparatus 1, the side from which air is taken in is referred to as "an inlet side" or "the upper side", and the side to which air is exhausted is referred to as "the outlet side" or "the lower side". The representations "the upper side" and "the lower side" do not necessarily indicate gravitational directions.

As shown in FIG. 1, the axial fan section 2 includes a center axis J1, a first axial fan 3, and a second axial fan 4. The second axial fan 4 is connected in series to an outlet-side end portion of the first axial fan 3. When the axial fan section 2 is driven, air is taken into the first axial fan 3 from the upper side, and exhausted toward the lower side along the center axis J1. The air exhausted from the first axial fan 3 is taken into the second axial fan 4, and exhausted toward the outlet side of the second axial fan 4 along the center axis J1. Accordingly, an air flow with a high static pressure and a large air quantity is generated by the axial fan section 2.

As shown in FIG. 1, the duct section 5, which is preferably made from a resin or plastic, is disposed adjacent to an outlet-side end portion of the axial fan section 2 (i.e., to an outlet of the second axial fan 4) along the center axis J1. The duct section 5 is guides the air exhausted from the axial fan section 2 to the inside of electronic equipment.

As shown in FIG. 1, the coupling section 6 includes a first coupling portion 61 and a second coupling portion 62. The first coupling portion 61 and the second coupling portion 62 are preferably thin metal plates, and both side portions thereof (both side portions in a direction which is not substantially perpendicular to the center axis J1) are bent. The first coupling portion 61 and the second coupling portion 62 cover the axial fan section 2 and the duct section 5 over the entire lengths thereof in the direction along the center axis J1.

Figure 2:
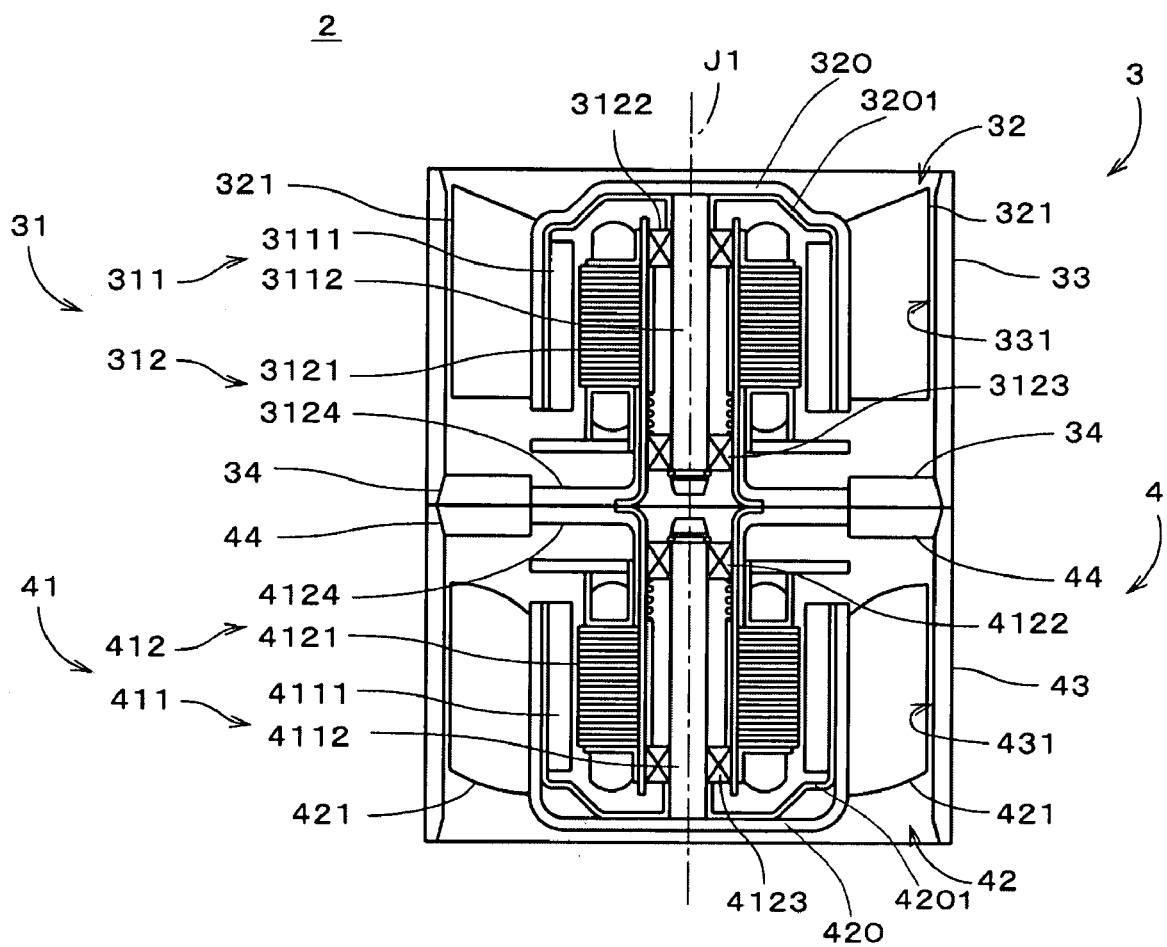
FIG. 2 is a sectional view of an axial fan section in the first preferred embodiment of the present invention.

Next, the structure of the axial fan section 2 will be described. FIG. 2 is a sectional view of the axial fan section 2 in the first preferred embodiment of the present invention. In FIG. 2, the sectional view of the axial fan section 2 in FIG. 1 is taken along a plane including the center axis J1.

As shown in FIG. 2, the first axial fan 3 preferably includes a first motor portion 31, a first impeller 32, a first housing 33, and a plurality of first supporting ribs 34.

The first housing 33 is a hollow member. The first motor portion 31, the first impeller 32, and the first supporting ribs 34 are disposed on the inside of the first housing 33.

As shown in FIGS. 1 and 2, the first impeller 32 includes a first cup portion 320 having a covered cylindrical shape and a plurality of first blades 321 (in the present preferred embodiment, seven first blades, for example). The first cup portion 320 and the first blades 321 are preferably integrally formed by injection molding with a resin or plastic. In the inside of the first cup portion 320, a first yoke 3201 having a covered cylindrical shape is attached by press fitting, or the like. On an outer circumferential surface of the first cup portion 320, the first blades 321 are arranged at regular pitches with the center axis J1 as the center.

The first motor portion 31 includes a first rotor portion 311 and a first stator portion 312.

The first rotor portion 311 is positioned on the upper side above the first stator portion 312. The first rotor portion 311 includes a first field magnet 3111 and a first shaft 3112. The first field magnet 3111 is substantially annular, and is fixed to an inner circumferential surface of the first yoke 3201 of the first impeller 32. The first shaft 3112 is substantially cylindrical. One end of the shaft 3112 on the axially upper side is fixed to a center portion of the first impeller 32.

The first stator portion 312 includes a first armature 3121, ball bearings 3122 and 3123, and a first base portion 3124. The first armature 3121 is radially opposed to the first field magnet 3111 of the first rotor portion 311. The ball bearings 3122 and 3123 support an upper portion and a lower portion of the first shaft 3112, respectively. The first base portion 3124 supports respective portions of the first stator portion 312.

When a driving current is supplied from an external power source (not shown) to the first armature 3121, a magnetic field is generated. A torque with the center axis J1 as the center is generated between the magnetic field generated by the first armature 3121 and the first field magnet 3111. In response to the torque, the first rotor portion 311 is driven and rotated in a relative manner to the first stator portion 311.

As shown in FIG. 2, the first base portion 3124 is a substantially disc-like member, and supports respective portions of the first stator portion 312. The plurality of first supporting ribs 34 are arranged at regular pitches on an outer circumferential surface of the first base portion 3124 with the center axis J1 as the center. The first supporting ribs 34 couple the outer circumferential surface of the first base portion 3124 to an inner circumferential surface of the first housing 33. In addition, the first base portion 3124, the first housing 33, and the first supporting ribs 34 are preferably formed as a single member by injection molding with a resin or plastic.

As shown in FIG. 2, the second axial fan 4 has substantially the same structure as the first axial fan 3. The second axial fan 4 is vertically inverted with respect to a direction substantially perpendicular to the center axis J1. The second axial fan 4 preferably includes a second motor portion 41, a second impeller 42, a second housing 43, and second supporting ribs 44. The second housing 43 is a hollow member. The second motor portion 41, the second impeller 42, and the second supporting ribs 44 are disposed on the inside of the second housing 43.

The second impeller 42 includes a second cup portion 420 having a covered cylindrical shape, and a plurality of second blades 421 (in the present preferred embodiment, seven second blades, for example). The second cup portion 42 and the second blades 421 are preferably integrally formed by injection molding with a resin or plastic. In the inside of the second cup portion 420, a second yoke 4201 having a covered cylindrical shape is attached by press fitting, or the like. On an outer circumferential surface of the second cup portion 420, the second blades 421 are arranged at regular pitches in a circumferential direction with the center axis J1 as the center.

The second motor portion 41 includes a second rotor portion 411 and a second stator portion 412.

The second rotor portion 411 is positioned lower than the second stator portion 412. The second rotor portion 411 includes a second field magnet 4111 and a second shaft 4112. The second field magnet 4111 is substantially annular, and is fixed to an inner circumferential surface of the second yoke 4201 of the second impeller 42. The second shaft 4112 is substantially cylindrical. One end portion of the second shaft 4112 on the axially upper side is fixed to a center portion of the second impeller 42.

The second stator portion 412 includes a second armature 4121, ball bearings 4122 and 4123, and a second base portion 4124. The second armature 4121 is radially opposed to the second field magnet 4111 of the second rotor portion 411. The ball bearings 4122 and 4123 support an upper portion and a lower portion of the second shaft 4112, respectively. The second base portion 4124 supports respective portions of the second stator portion 412.

When a driving current is supplied from an external power source (not shown) to the second armature 4121, a magnetic field is generated by the second armature 4121. A torque with the center axis J1 as the center is generated between the magnetic field generated by the second armature 4121 and the second field magnet 4111. In response to the torque, the second rotor portion 411 is driven and rotated in a relative manner to the second stator portion 412.

In the present preferred embodiment, the axial fan section 2 is a so-called counter-rotating axial fan. That is, the rotational direction of the second rotor portion 411 around the center axis J1 is opposite to the rotational direction of the first rotor portion 311 around the center axis J1.

As shown in FIG. 2, the second base portion 4124 is a substantially disc-like member. The second base portion 4124 supports the respective portions of the second stator portion 412, and is axially opposed to the first base portion 3124. The second supporting ribs 44 are arranged at regular pitches on an outer circumferential surface of the second base portion 4124 in the circumferential direction with the center axis J1 as the center. In addition, the second supporting ribs 44 are coupled to the outer circumferential surface of the second base portion 4124 and an inner circumferential surface of the second housing 43. The second base portion 4124, the second housing 43, and the second supporting ribs 44 are preferably formed as a single member by injection molding with a resin or plastic.

Figure 3:
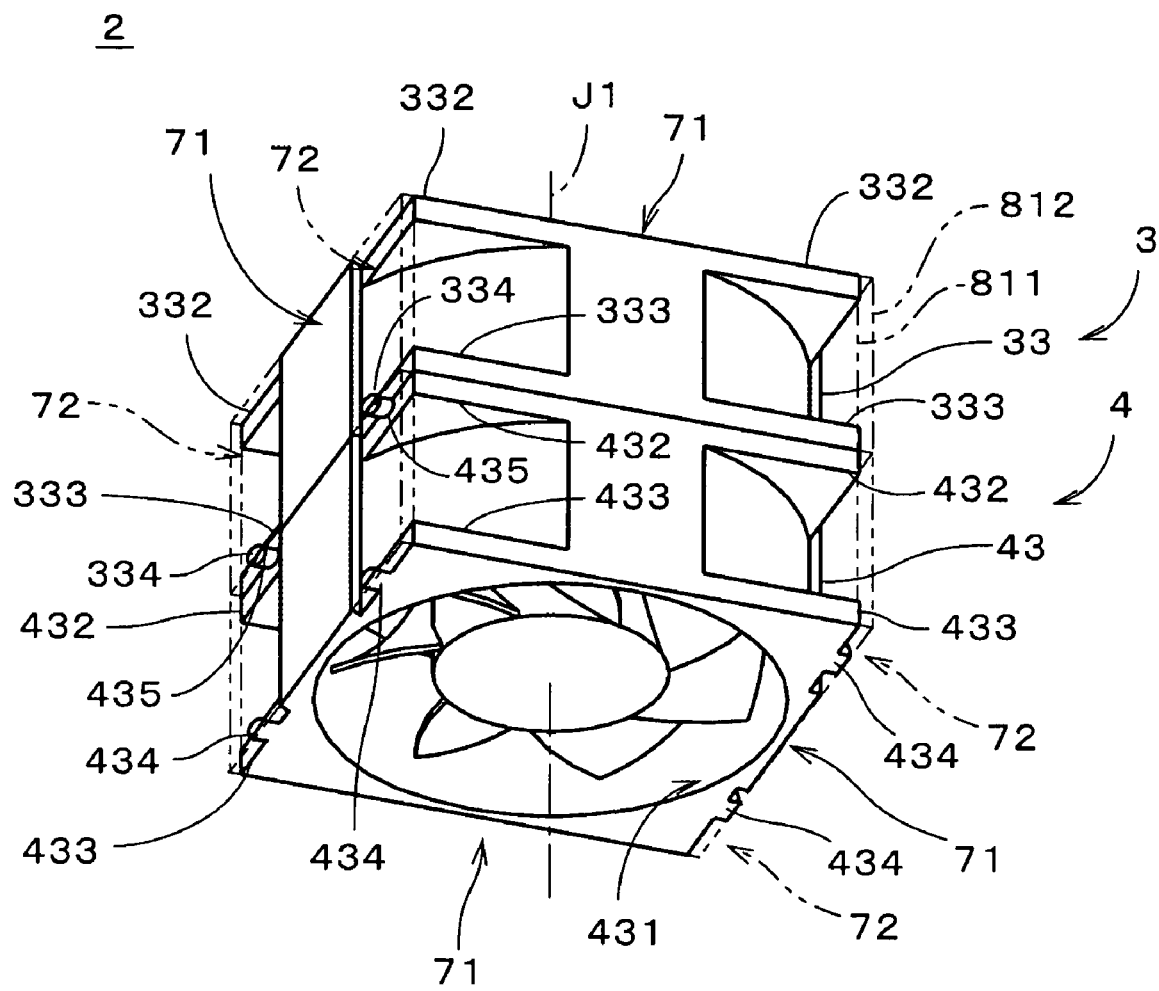
FIG. 3 is a perspective view of the axial fan section in the first preferred embodiment of the present invention.

FIG. 3 is a perspective view of the axial fan section 2 in the first preferred embodiment of the present invention. In a plan view, end portions of the first housing 33 and the second housing 43 on the inlet side and on the outlet side are substantially square-shaped flanges, respectively.

As shown in FIG. 3, an outer shape defined by coupling the end portions of the first housing 33 on the inlet and outlet sides preferably is a substantially square plate. In FIG. 3, lines for coupling both end portions of the first housing 33 on the inlet and outlet sides in the direction along the center axis J1, and corner portions of a rectangular parallelepiped which encloses both end portions of the first housing 33 on the inlet and outlet sides and is externally adjacent to the side surface of the first housing 33 are depicted by chain double-dashed lines.

Similarly, in FIG. 3, an outer shape defined by coupling the end portions of the second housing 43 on the inlet and outlet sides preferably is a substantially square plate. In FIG. 3, lines for coupling both end portions of the second housing 43 on the inlet and outlet sides in the direction along the center axis J1, and corner portions of a rectangular parallelepiped which encloses both end portions of the second housing 43 on the inlet and outlet sides and is externally adjacent to the side surface of the actual second housing 43 are depicted by chain double-dashed lines.

In FIG. 3, both outer side surfaces of the axial fan section 2 on the right and left sides have the same shape, and both outer surfaces thereof in FIG. 3 on the front and back sides have the same shape. In addition, in the present preferred embodiment, the sizes of the first housing 33 and the second housing 43 are preferably the same.

In the following description, an outer shape including lines virtually coupling the end portions of the first housing 33 and the second housing 43 in the direction along the center axis J1 is collectively defined as an outer shape 811. A virtual rectangular parallelepiped externally adjacent to the outer shape 811 of the first housing 33 and the second housing 43 is defined as an externally adjacent square plate 812. In the following description, the outer side surfaces of the first housing 33 and the second housing 43 indicate side surfaces of the externally adjacent square plate 812.

As shown in FIGS. 2 and 3, inner side surfaces of the first housing 33 and the second housing 43 are substantially cylindrical with the center axis J1 as the center. On the axially upper and lower sides of the inner side surfaces 331 and 431, an inlet and an outlet are defined, respectively. As described above, the outer shape of the first housing 33 and the second housing 43 preferably is substantially square. Accordingly, in a first region 71 of the first housing 33 and the second housing 43, the distance (i.e., the thickness) between the inner side surface 331 and the outer side surface is the smallest. The first region 71 extends in a direction substantially parallel to the center axis J1 in each outer side surface. Specifically, the first region 71 is a region in which the outer side surface of the first housing 33 (or the second housing 43) is radially closest to the inner side surface 331 (or the inner side surface 431 of the second housing 43).

As shown in FIG. 3, in the first housing 33 and the second housing 43, a width of the outer side surface on each of the front and back sides (the dimension between the right and left end portions of the first housing 33 (or the second housing 43) in FIG. 3) is slightly larger than a width of the outer side surface on each of the right and left sides (the dimension between the front and back end portions of the first housing 33 (or the second housing 43) in FIG. 3).

Moreover, as shown in FIG. 2, in the corner portions of the end portions of the inner side surface 331 of the first housing 33 on the inlet and outlet sides, the radial distance between the center axis J1 and the inner side surface 331 is increased. In other words, in the inlet and the outlet of the first housing 33, surfaces inclined with respect to the center axis J1 (i.e., venturi surfaces) are defined.

As shown in FIG. 2, in the corner portions of the end portions of the inner side surface 431 of the second housing 43 on the inlet and outlet sides, the radial distance between the center axis J1 and the inner side surface 431 is increased. In other words, on the inlet and the outlet of the second housing 43, surfaces inclined with respect to the center axis J1 (i.e., venturi surfaces) are defined.

In the inlets and outlets of the first housing 33 and the second housing 43, because of the inclined surfaces which are respectively provided, when the axial fan section 2 is driven, air is smoothly taken in through the inlet of the first housing 33, and smoothly exhausted from the outlet of the second housing 43. As a result, in the axial fan section 2, when air is taken in or exhausted out, the noise generated by the air which contacts with the inlet and the outlet of the first housing 33 (or the second housing 43) can be reduced.

As shown on the left side of FIG. 3, in the end portions of the outer shape of the first housing 33 on the inlet and outlet sides, portions 332 and 333 positioned on both sides in a width direction (that is, in the vicinity of the corner portions of the outer shape of the first region 71 on both sides) are slightly recessed from the outer side surface of the externally adjacent square plate 812 positioned on the leftmost side. In other words, end portions of the portions 332 and 333 on the left side in FIG. 3 do not exist in the same plane as the outer side surface of the externally adjacent square plate 812 on the left side of FIG. 3. The end portions of the portions 332 and 333 are positioned on the right side in FIG. 3.

Similarly, on the left side of FIG. 3, in the end portions of the outer shape of the second housing 43 on the inlet and outlet sides, portions 431 and 433 positioned on both sides in the width direction are slightly recessed from the outer side surface of the externally adjacent square plates 812 on the left side. In other words, left-side end portions of the portions 432 and 433 do not exist in the same plane as the outer side surface of the externally adjacent square plate 812 on the left side of FIG. 3. The left-side end portions of the portions 432 and 433 are positioned on the right side in FIG. 3.

As shown in FIG. 3, the portions 332, 333, 432, and 433 are arranged in the direction along the center axis J1. In the outer shape 811, the corner portions joining the portions 332, 333, 432, and 433 in the direction along the center axis J1 can be understood as being shallowly cut out from the externally adjacent square plate 812. In the following description, a space between the outer shape and the externally adjacent square plate 812 is referred to as a housing cut-out portion 72. Actually, the portions 332, 333, 432, and 433 preferably are not formed by cutting or the like. The portions 332, 333, 432, and 433 are preferably formed simultaneously when the first housing 33 and the second housing 43 are preferably integrally formed by injection molding with a resin or plastic. In FIG. 3, on the right side of the outer shape of the first housing 33 and the second housing 43, housing cut-out portions 72 are defined similarly to the left side.

In addition, as shown on the left side of FIG. 3, in the outer shape 811, two protruding portions 434 are respectively provided in the end portion of the second housing 43 on the outlet side (i.e., in the end portions of the two housing cut-out portions 72 on the outlet side). Each of the protruding portions 434 preferably has a substantially half-round cylindrical shape protruding from the outer side surface of the second housing 43. A chord of the protruding portion 434 is directed to the outlet side, and positioned in a plane including an end surface of the second housing 43 on the outlet side.

On the other hand, as shown on the left side of FIG. 3, in the inlet-side end portion of the second housing 43, two protruding portions 435 are provided. Each of the protruding portions 435 also has a substantially half-round cylindrical shape protruding from the outer side surface of the second housing 43. A chord of the protruding portion 435 is directed to the inlet side, and positioned in a plane including an end surface of the second housing 43 on the inlet side.

As shown on the left side of FIG. 3, in the first housing 33, two protruding portions 334 are defined in the end portion of the first housing 33 on the outlet side. Each of the protruding portions 334 has a substantially half-round cylindrical shape protruding from an outer side surface of the first housing 33.

As shown on the left side of FIG. 3, when the first housing 33 and the second housing 43 are combined, the protruding portions 334 and the protruding portions 435 are mutually opposed, and the chords of the protruding portions 334 come into contact with the chords of the protruding portions 435. Accordingly, substantially cylindrical protrusions defined by the protruding portions 334 and the protruding portions 435 are created.

Similarly, on the right side of FIG. 3, protruding portions 434 and 435 are provided in the end portions of the second housing 43 on the outlet and inlet sides in the housing cut-out portions 72. In addition, in the first housing 33, protruding portions 334 are defined in the end portion on the outlet side. When the first housing 33 and the second housing 43 are combined, the chord of the protruding portion 334 and the chord of the protruding portion 435 are combined, thereby defining a substantially cylindrical protrusion.

Figure 4:
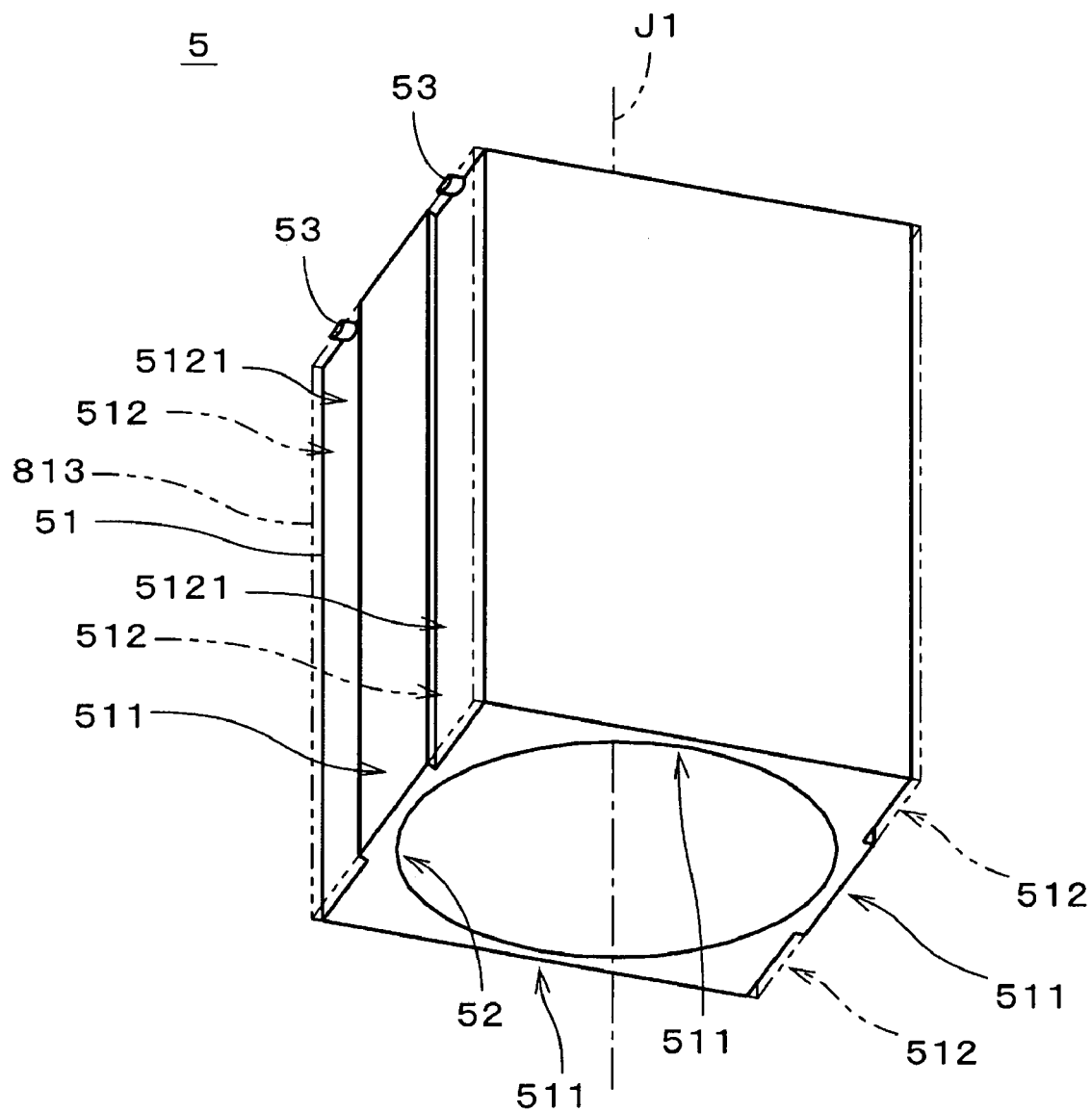
FIG. 4 is a perspective view of a duct section in the first preferred embodiment of the present invention.

Next, the shape of the duct section 5 will be described in detail. FIG. 4 is a perspective view of the duct section 5 in the first preferred embodiment of the present invention.

As shown in FIG. 4, the duct section 5 is made from a resin or plastic, and an outer shape 51 of the duct section 5 preferably has a substantially square-plate shape. The area of the outer shape 51 of the duct section 5 in the plan view is substantially equal to the area of the outer shape of the first housing 33 and the second housing 43 in the plan view.

In the following description, a virtual rectangular parallelepiped which is externally adjacent to the outer shape 51 of the duct section 5 is referred to as an externally adjacent square plate 813 of the duct section 5. In the following description, the side surface of the externally adjacent square plate 813 and the outer side surface of the duct section 5 indicate the same.

As shown in FIG. 4, in the duct section 5, the right and left outer side surfaces of the outer shape 51 in FIG. 4 have the same shape, and the front and back outer side surfaces of the outer shape 51 in FIG. 4 have the same shape.

As shown in FIG. 4, an inner side surface 52 of the duct section 5 is substantially cylindrical. An inner diameter of the inner side surface 52 of the duct section 5 is substantially equal to an inner diameter of an inner side surface 431 (see FIG. 2) in the end surface of the second axial fan 4 on the outlet side. That is, the outer shape 51 of the duct section 5 has a shape obtained by extending the outer shape of the first housing 33 and the second housing 43 in the axial direction. In addition, the inner side surface 52 of the duct section 5 has a shape obtained by downwardly extending the outlet of the inner side surface 431 of the second housing 43 in the axial direction.

In FIG. 4, a width of the outer side surfaces on the front and back sides of the duct section 5 in FIG. 4 (i.e., a width in a direction substantially perpendicular to the center axis J1 and substantially parallel to the outer side surface) is slightly larger than a width of the outer side surfaces on the right and left sides of the duct section 5 in FIG. 4.

The surface roughness of the inner side surface 52 of the duct section 5 is small when compared with the outer side surface. Accordingly, a flow-path resistance of the inner side surface 52 of the duct section 5 with respect to the air exhausted from the axial fan section 2 can be reduced. As a result, air can smoothly flow through the inner side surface 52 of the duct section 5, and a reduction in static pressure of the airflow can be minimized.

As shown in FIG. 4, on the four outer side surfaces of the duct section 5, regions 511 in which the radial thickness of the duct section 5 is the smallest (hereinafter referred to as first regions 511) are provided. In the first region 511, the outer side surface and the inner side surface 52 of the duct section 5 are radially closest to each other. The first region 511 extends in the direction along the center axis J1 in the center of the respective outer side surface in the width direction.

As shown on the left side of FIG. 4, in the outer side surface of the duct section 5, two regions 5121 are defined on both sides of the center in the width direction so as to extend in the direction along the center axis J1. The region 5121 is slightly recessed with respect to the left side surface of the externally adjacent square plate 813. That is, the region 5121 is positioned on the right side from the externally adjacent square plate 813 in FIG. 4. A space between the region 5121 and the externally adjacent square plate 813 can be considered as a shallow cut-out portion of the externally adjacent square plate 813 in a direction substantially parallel to the center axis J1.

Accordingly, in the following description, the space between the region 5121 and the externally adjacent square plate 813 is referred to as a duct cut-out portion 512.

The width and the depth of the duct cut-out portion 512 are substantially equal to the width and the depth of the housing cut-out portion 72 (see FIG. 3) of the first housing 33 and the second housing 43. The duct cut-out portion 512 is preferably formed simultaneously when the duct section 5 is preferably formed by injection molding.

As shown on the left side of FIG. 4, two protruding portions 53 are provided in end portions of the duct cut-out portions 512 of the duct section 5 on the inlet side, respectively. The protruding portions 53 are substantially semi-round cylindrical portions extending from the outer shape 51. The chord of the protruding portions 53 are directed to the inlet side, and are positioned in a plane including the end surface of the duct section 5 on the inlet side. The protruding portions 53 and the protruding portions 434 disposed in the outlet-side end portion of the second housing 43 (see FIG. 3) are mutually opposed. When the duct section 5 and the second housing 43 are combined, the protruding portions 53 come into contact with the protruding portions 434, thereby forming substantially cylindrical protrusions. On the right side of FIG. 3, protruding portions 53 are provided in the end portions of the duct cut-out portions 512 on the inlet side, respectively.

Figure 5:
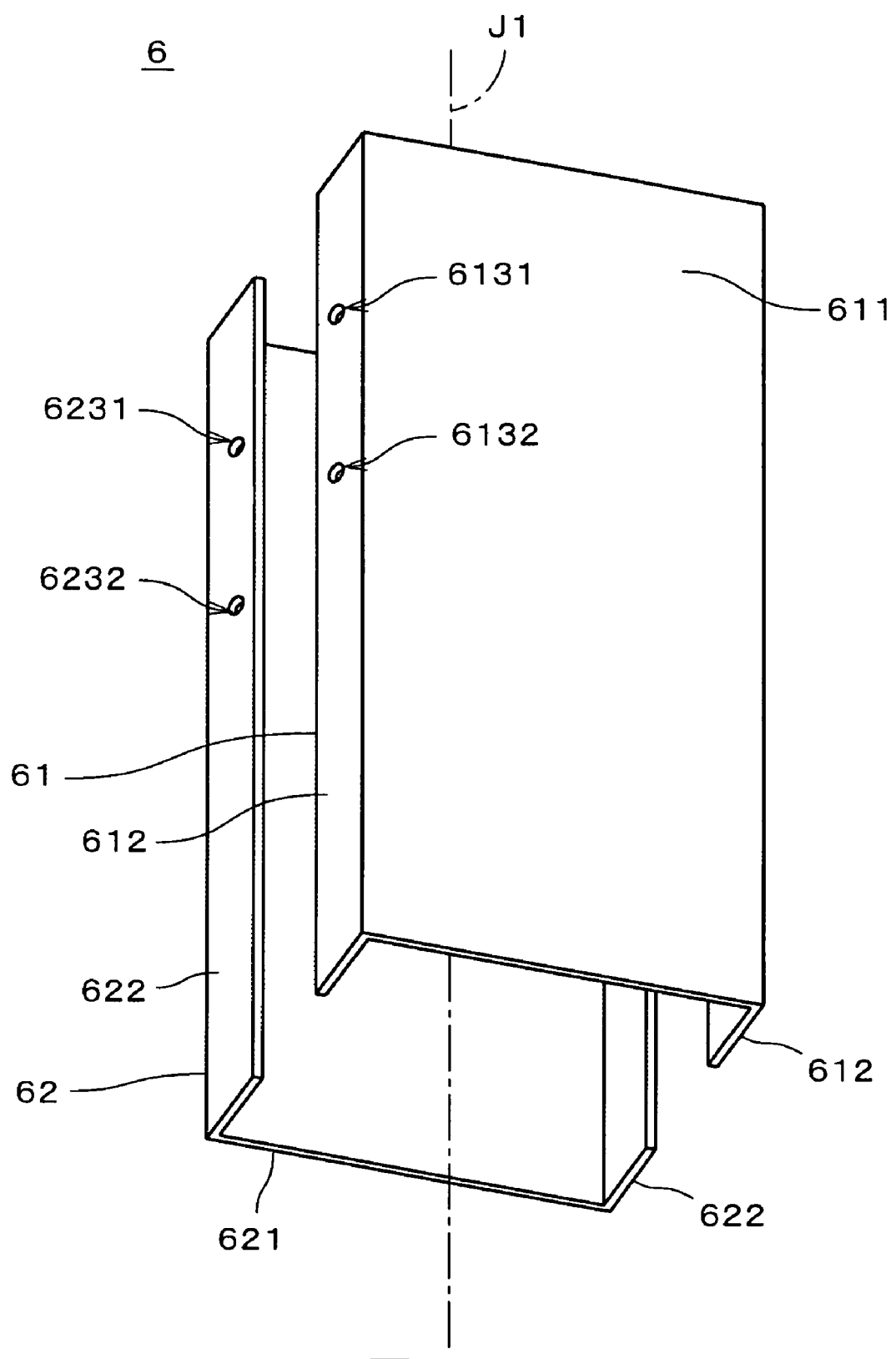
FIG. 5 is a perspective view of a coupling section in the first preferred embodiment of the present invention.

Next, the coupling section 6 will be described. FIG. 5 is a perspective view of the coupling section 6 in the first preferred embodiment of the present invention. As shown in FIG. 5, the coupling portion 6 includes a first coupling member 61 and a second coupling member 62.

As shown in FIG. 5, the first coupling member 61 is preferably formed by press working a single thin plate of a substantially rectangular shape. The first coupling member 61 includes a first flat-plate portion 611 extending in the direction along the center axis J1, and two first bent portions 612. In right and left end portions of the first flat-plate portion 611 in FIG. 5, the first bent portions 612 are bent from the front side to the back side of FIG. 5. In other words, the first bent portions 612 are bent to the side of the second coupling member 62 in both end portions of the first flat-plate portion 611 in the width direction (i.e., a direction substantially perpendicular to the center axis J1 and substantially parallel to the first flat-plate portion 611), so that the first bent portions 612 are substantially perpendicular to the first flat-plate portion 611.

Similarly, in FIG. 5, the second coupling member 62 is preferably formed by press working of a single thin plate of a substantially rectangular shape. The second coupling member 62 includes a second flat-plate portion 621 extending in the direction substantially parallel to the center axis J1, and two second bent portions 622. In right and left end portions of the second flat-plate portion 621 in FIG. 5, the second bent portions 622 are bent from the back side to the front side of FIG. 5. In other words, the second bent portions 622 are bent to the side of the first coupling member 61 in both end portions of the second flat-plate portion 621 in the width direction, so that the second bent portions 622 are substantially perpendicular to the second flat-plate portion 621.

As described above, each of the first coupling member 61 and the second coupling member 62 of the coupling section 6 is preferably formed by bending a single thin plate by press working or the like. Therefore, the coupling section 6 can be easily produced at a low cost.

Figure 6:
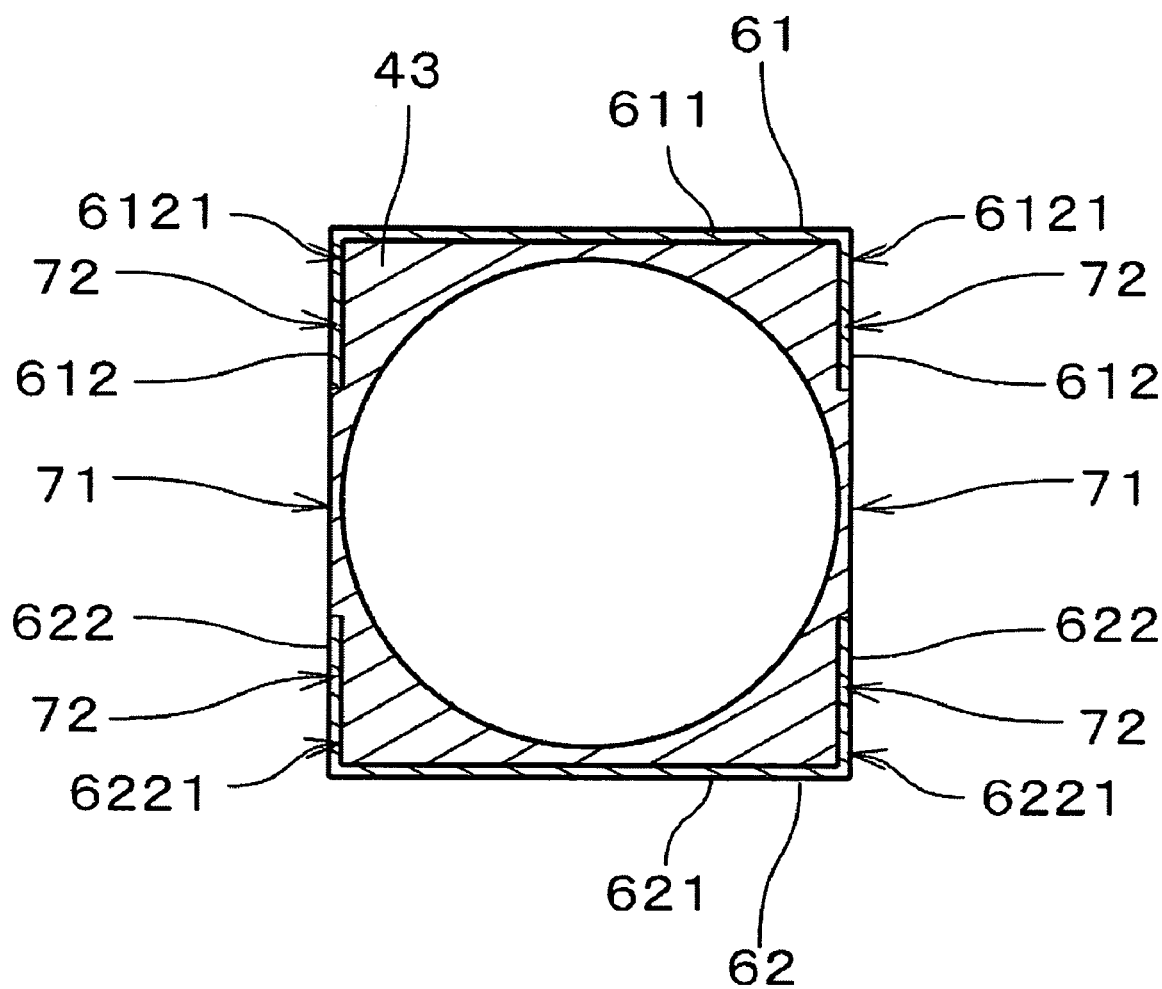
FIG. 6 is a sectional view of a second axial fan taken along a plane perpendicular to a center axis in the first preferred embodiment of the present invention.
Figure 7:
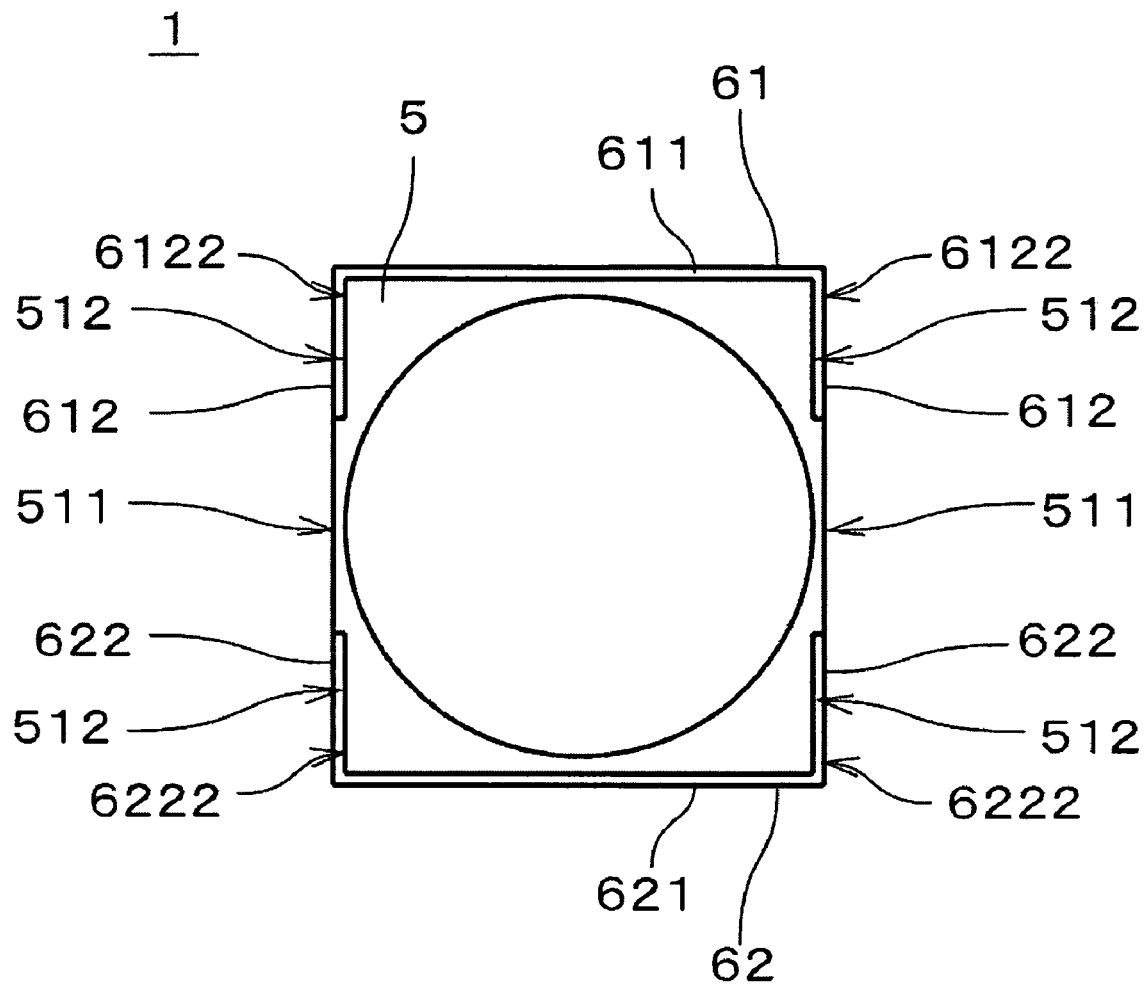
FIG. 7 is a bottom view of the fan apparatus of the first preferred embodiment of the present invention when viewed from the outlet side thereof.

FIG. 6 is a sectional view of the second axial fan 4 taken along a plane perpendicular to the center axis J1 in the first preferred embodiment of the present invention. In more detail, FIG. 6 is a sectional view of an outlet-side end portion of the second axial fan 4 taken along a plane parallel to the X-Y plane perpendicular to the center axis J1 (see FIG. 1) and viewed from the lower side (from the outlet side). FIG. 7 is a bottom view of the fan apparatus 1 viewed from the outlet side in the first preferred embodiment of the present invention.

In FIGS. 6 and 7, the axial fan section 2 and the duct section 5 are coupled by the coupling section 6 (see FIG. 5). As shown in FIGS. 6 and 7, the first flat-plate portion 611 of the first coupling member 61 abuts against the outer side surfaces of the first housing 33, the second housing 43, and the duct section 5 on the upper side of the figures. Similarly, in FIGS. 6 and 7, the second flat-plate portion 621 of the second coupling member 62 abuts against the surfaces of the first housing 33, the second housing 43, and the duct section 5 on the lower side of the figures.

Figure 8:
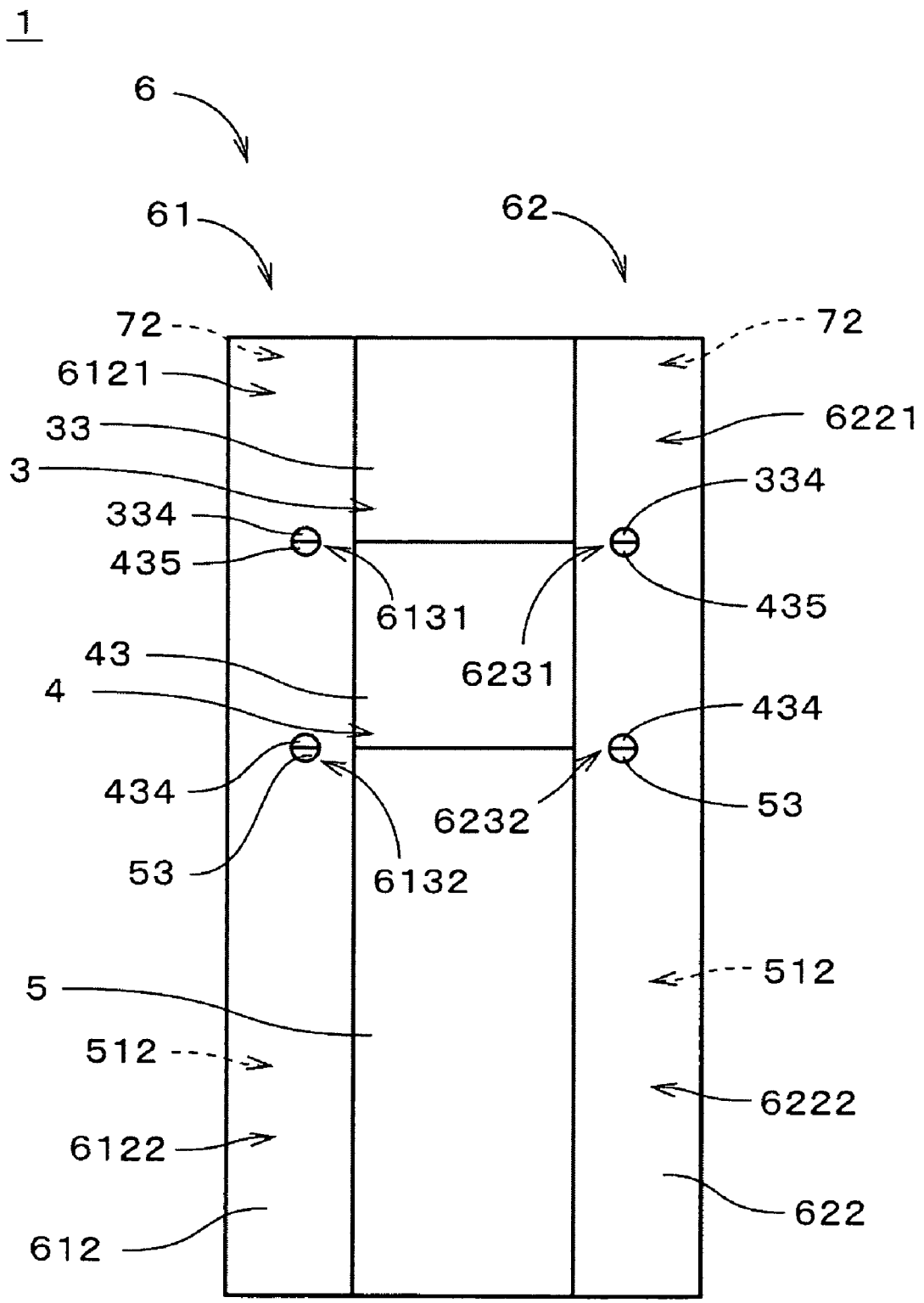
FIG. 8 is a side view of the fan apparatus shown in FIG. 1.

FIG. 8 is a side view of the fan apparatus 1 shown in FIG. 1. As shown in FIGS. 6, 7, and 8, the first flat-plate portion 611 of the first coupling member 61 abuts against the axial fan section 2 and the duct section 5. Accordingly, inlet-side portions 6121 of the first bent portions 612 of the first coupling member 61 are attached to the housing cut-out portions 72 along the outer side surfaces of the first housing 33 and the second housing 43. Outlet side portions 6122 of the first bent portions 612 are attached to the duct cut-out portions 512 along the outer side surface of the duct section 5. In other words, as shown in FIGS. 6 and 7, toward the two housing cut-out portions 72 and the two duct cut-out portions 512 disposed on the two opposed outer side surfaces of the first housing 33, the second housing 43, and the duct section 5, the first bent portions 612 positioned on both sides of the first coupling member 61 in the width direction are bent along the corner portions of the first housing 33, the second housing 43, and the duct section 5.

Similarly, the second flat-plate portion 621 of the second coupling member 62 abuts against the axial fan section 2 and the duct section 5. Accordingly, inlet-side portions 6221 of the second bent portions 622 are attached to the duct cut-out portions 512 along the outer side surfaces of the first housing 33 and the second housing 43. In other words, as shown in FIGS. 6 and 7, the second bent portions 622 on both sides of the second coupling member 62 in the width direction are bent along the corner portions of the first housing 33, the second housing 43, and the duct section 5 toward the two housing cut-out portions 72 and the two duct cut-out portions 512 disposed on the two mutually opposed outer side surfaces of the first housing 33, the second housing 43, and the duct section 5.

As shown in FIG. 5, two substantially circular hole portions 6131 and 6132 are provided in one of the first bent portions 612 of the first coupling member 61 positioned on the left side in the figure. Similarly, hole portions 6131 and 6132 are provided in the first bent portion 612 on the other side (on the right side in the figure).

As shown in FIG. 5, two substantially circular hole portions 6231 and 6232 are also provided in one of the second bent portions 622 of the second coupling member 62 positioned on the left side in the figure. Similarly, hole portions 6231 and 6232 are defined in the second bent portion 622 on the other side (on the right side in the figure).

As shown in FIG. 8, the substantially circular protrusions defined by combining the protruding portions 334 of the first axial fan 3 and the protruding portions 435 of the second axial fan 4 are placed into the hole portion 6131 of the first bent portion 612 and the hole portion 6231 of the second bent portion 622, respectively. Similarly, the substantially circular protrusions defined by combining the protruding portions 434 of the second axial fan 4 and the protruding portions 53 of the duct section 5 are placed into the hole portion 6132 of the first bent portion 612 and the hole portion 6232 of the second bent portion 622, respectively. Accordingly, the first bent portion 612 and the second bent portion 622 are attached to the housing cut-out portions 72 and the duct cut-out portions 512, respectively. As a result, the first housing 33 and the second housing 43 of the axial fan section 2 and the duct section 5 are firmly coupled by the coupling section 6.

As shown in FIGS. 6 and 7, in the coupling section 6, the widths of the inner-side surfaces of the first bent portion 612 and the second bent portion 622 of the first coupling member 61 and the second coupling member 62 are substantially equal to the width of the housing cut-out portion 72 and the width of the duct cut-out portion 512. The thickness of the first bent portion 612 and the second bent portion 622 is substantially equal to the depth of the housing cut-out portion 72 and the depth of the duct cut-out portion 512. With such a configuration, when the coupling member 6 is combined with the first housing 33 and the second housing 43, the outer side surfaces of the first bent portion 612 and the second bent portion 622 correspond to the outer side surfaces of the externally adjacent square plate 812 of the first housing 33 and the second housing 43 (see FIG. 3) and the externally adjacent square plate 813 of the duct section 5 (see FIG. 4). That is, the outer side surfaces of the first bent portion 612 and the second bent portion 622 are substantially in the same plane as the surfaces of the first regions 71 of the first housing 33 and the second housing 43, and the first region 511 of the duct section 5. As a result, the outer shape of the entire fan apparatus 1 can be kept small.

Figure 9:
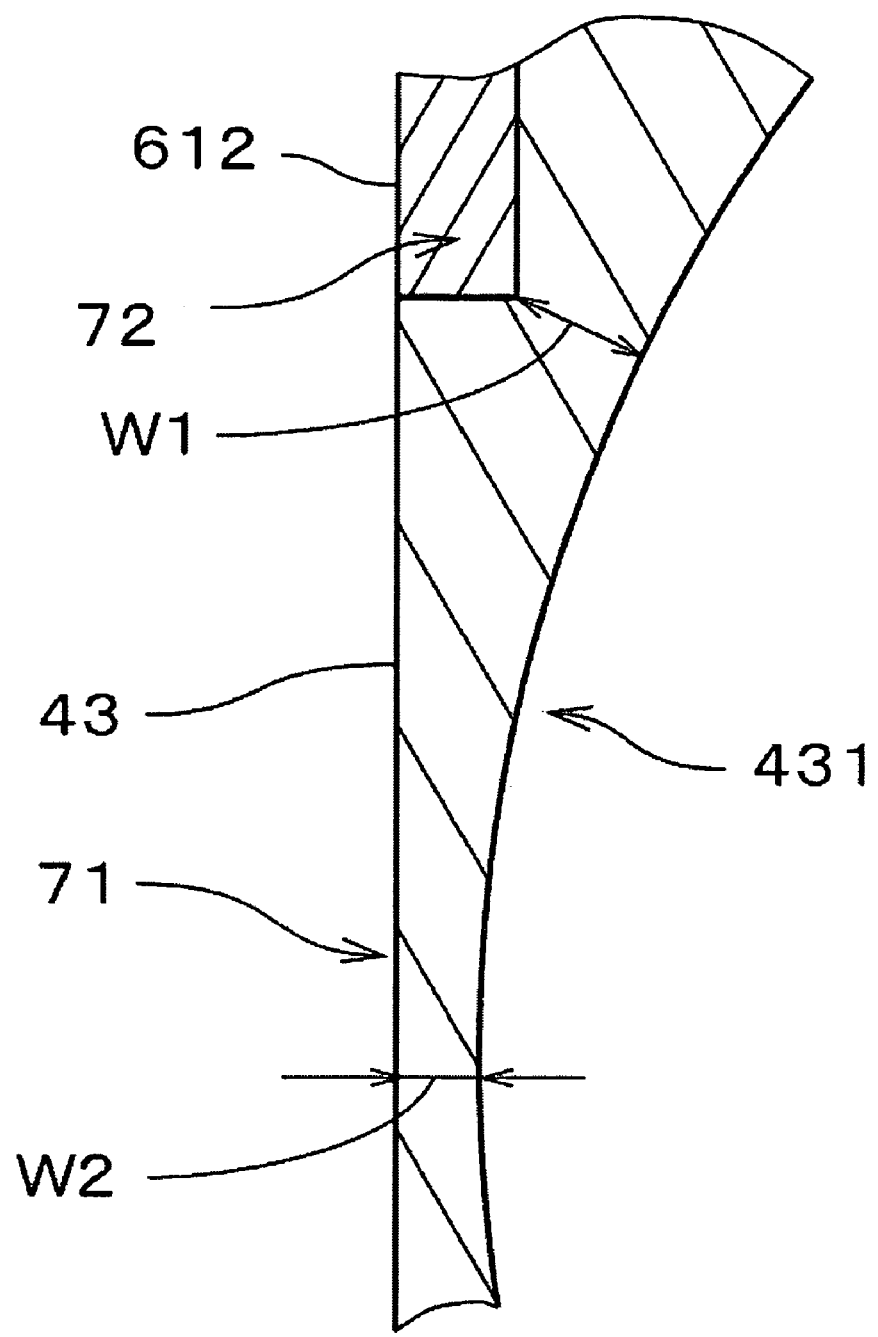
FIG. 9 is an enlarged view of a portion of a second housing and the duct section in the first preferred embodiment of the present invention.

FIG. 9 is an enlarged view of a portion of the second housing 43 and the duct section 5 in the first preferred embodiment of the present invention. In more detail, FIG. 9 shows a portion between the first region 71 of the second housing 43 on the left side of FIG. 6 and the first bent portion 612 of the first coupling member 61.

As shown in FIG. 9, the distance (i.e., thickness) W1 between the housing cut-out portion 72 and the inner side surface 431 of the second housing 43 in the axial fan section 2 (see FIG. 3) is preferably equal to or larger than the thickness W2 of the second housing 43 in the first region 71. The thickness W2 is desirably equal to or larger than about 0.7 mm, for example, which is the minimum possible thickness defined by injection molding with a resin or plastic, for example. In addition, the thickness W2 may be about 2.5 mm or less, for example, which is not overly thick. Similarly, the thickness W1 between the other one of the housing cut-out portions 72 and the inner side surface 431 of the second housing 43 is preferably equal to or larger than the thickness of the other one of the first regions 71 of the second housing 43.

As described above, the first housing 33 and the second housing 43 (see FIG. 3) have substantially the same size and substantially the same shape. Accordingly, similarly to the second housing 43, the distance (i.e., the thickness) between the inner side surface 331 of the first housing 33 (see FIG. 2) and the housing cut-out portion 72 is equal to or larger than the thickness of first region 71 of the first housing 33. As shown in FIG. 9, in the first housing 33 and the second housing 43, the inner side surfaces 331 and 431 may be closer to the outer side surface than the inner-side surface (the bottom surface) of the housing cut-out portion 72.

As shown in FIG. 6, among the four outer side surfaces of the second housing 43, in the two outer side surfaces in which the housing cut-out portions 72 are not defined (i.e., in the outer side surfaces on the front side and the back side shown in FIG. 3), the thickness of the second housing 43 is substantially equal to the thickness of the first region 71 of the outer side surfaces in which the housing cut-out portions 72 are provided (the right and left outer side surfaces shown in FIG. 3). With such a configuration, when the second housing 43 is molded, the occurrence of sink marks (recesses in the molded article of resin or plastic) can be minimized. Among the four outer side surfaces of the first housing 33, in the two outer side surfaces in which the housing cut-out portions 72 are not defined, the thickness of the first housing 33 is substantially equal to the thickness of the first region 71 in the outer side surfaces in which the housing cut-out portions 72 are provided. As a result, when the first housing 33 is molded, the occurrence of sink marks can be minimized.

Figure 10:
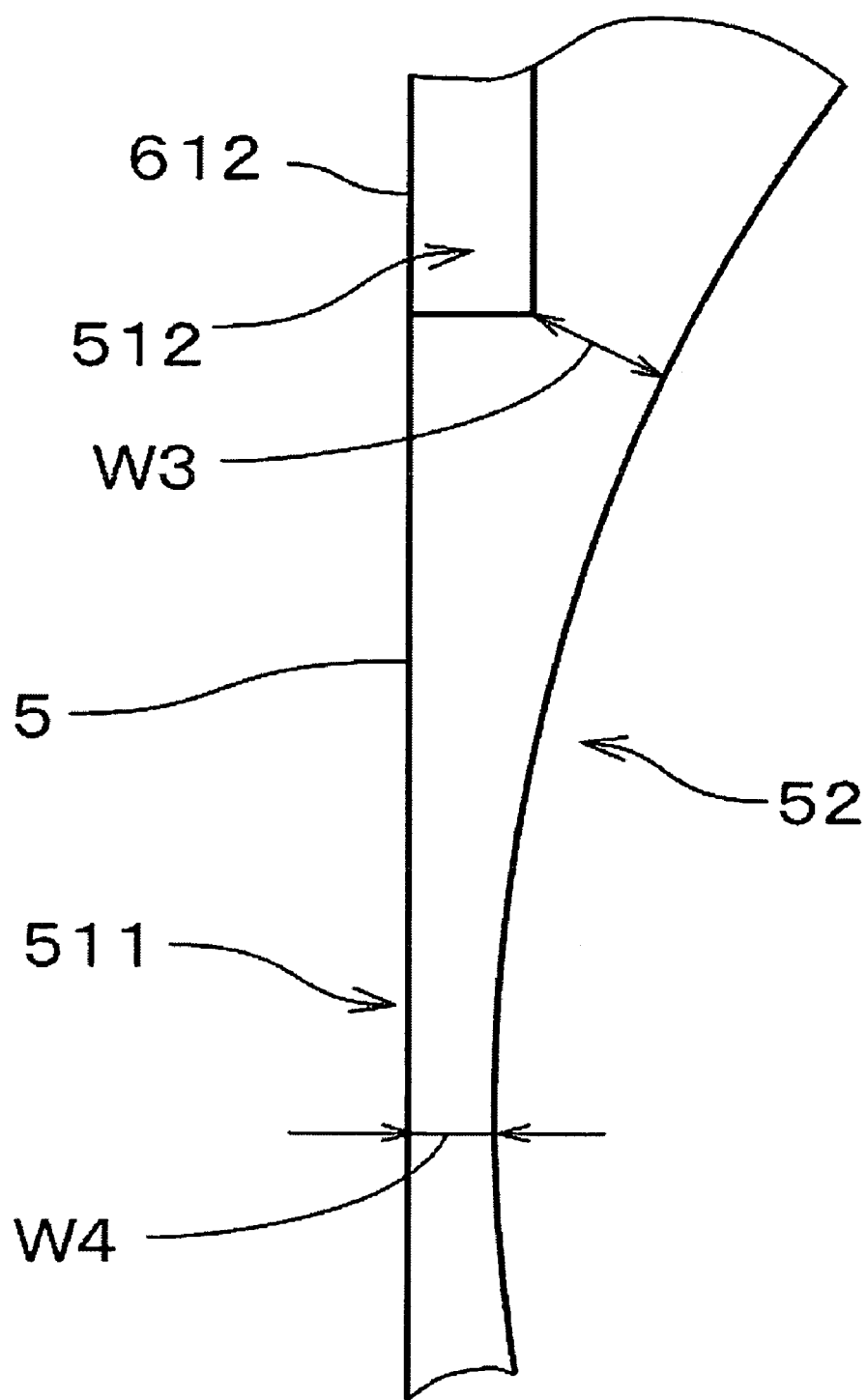
FIG. 10 is an enlarged view of a portion of the duct section and the first coupling member in the first preferred embodiment of the present invention.

FIG. 10 is an enlarged view of a portion of the duct section 5 and the first coupling member 61 in the first preferred embodiment of the present invention. In more detail, FIG. 10 shows a portion between the first region 511 of the duct section 5 on the left side and the first bent portion 612 of the first coupling member 61 in an enlarged manner.

As shown in FIG. 10, the sectional shapes of the first region 511 of the duct section 5 and the duct cut-out portion 512 are similar to those of the first region 71 of the second housing 43 and the housing cut-out portion 72 shown in FIG. 9. The distance (i.e., the thickness) between the duct cut-out portion 512 of the duct section 5 and the inner side surface 52 of the duct section 5 is equal to or larger than the thickness W4 of the first region 511 in the duct section 5. Similarly, the thickness W3 between the other one of the duct cut-out portions 512 and the inner side surface 52 of the duct section 5 is equal to or larger than the thickness of the other first region 511 of the duct section 5. As shown in FIG. 10, in the duct section 5, the inner side surface 52 may be closer to the outer side surface than the inner-side surface (the bottom surface) of the duct cut-out portion 512.

According to the fan apparatus 1 with the above-described configuration, the ventilation of the inside of the electronic equipment, the cooling of electronic components, and the like can be performed without decreasing the air flow and the static pressure of the air exhausted from the axial fan section 2.

In addition, in the present preferred embodiment, the coupling section 6 is attached to the housing cut-out portions 72 of the first housing 33 and the second housing 43 and the duct cut-out portions 512 of the duct section 5 excluding the first regions 71 and the first regions 511. Accordingly, without being affected by the coupling section 6, the inner diameters of the inner side surface 331 of the first housing 331, the inner side surface 431 of the second housing 43, and the inner side surface 52 of the duct section 5 can be increased. For this reason, the airflow path area is increased in the axial fan section 2 and the duct section 5. As a result, static pressure and air flow of the fan apparatus 1 can be improved.

When the first housing 33, the second housing 43, and the duct section 5 are coupled by the two first bent portions 612 of the first coupling member 61 and the two second bent portions 622 of the second coupling member 62, the four corners of the first housing 33 on the outlet side, the four corners of the second housing 43 on the inlet and outlet sides, and the four corners of the duct section 5 on the inlet side are fixed. Accordingly, a strong coupling of the first housing 33, the second housing 43, and the duct section 5 can be obtained.

Moreover, the coupling section 6 is opposed to the first housing 33, the second housing 43, and the duct section 5 over the entire length thereof in the axial direction. The coupling section 6 covers substantially the entire the first housing 33, the second housing 43, and the duct section 5. The attachment of the coupling section 6 can improve the stiffness of the axial fan section 2 and the duct section 5.

The outer shape 51 of the duct section 5 can be obtained by extending the outer shape 811 of the axial fan section 2 in the direction along the center axis J1. In addition, the coupling section 6 is disposed along the outer side surfaces of the first housing 33, the second housing 43, and the duct section 5. Accordingly, the fan apparatus 1 preferably has a substantially square-shaped tubular structure as a whole. As a result, the fan apparatus 1 can be easily attached to electronic equipment and the like, and the installation of the fan apparatus 1 can be easily performed.

Figure 11:
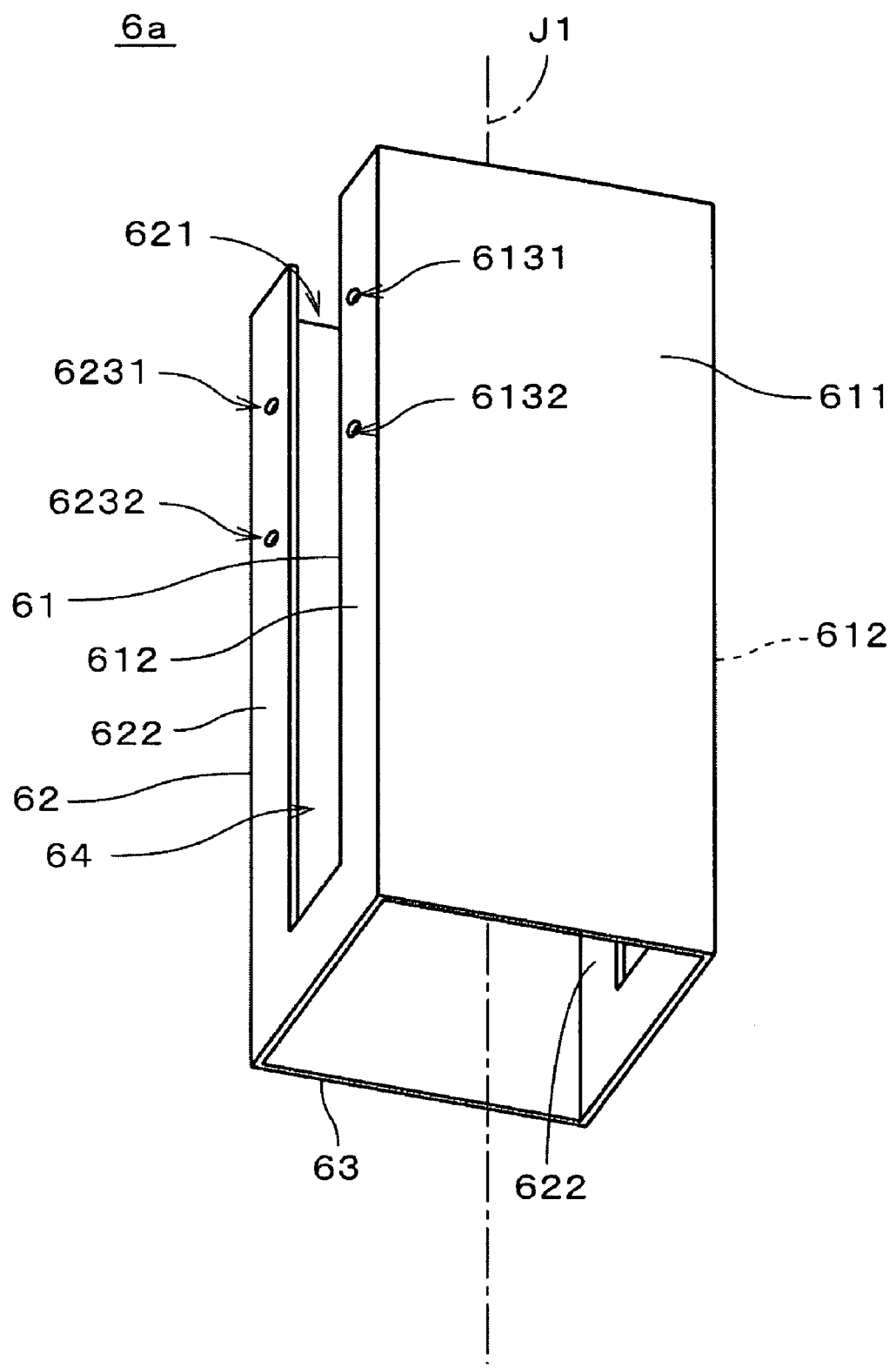
FIG. 11 is a perspective view showing a coupling section in another example of the first preferred embodiment of the present invention.
Figure 12:
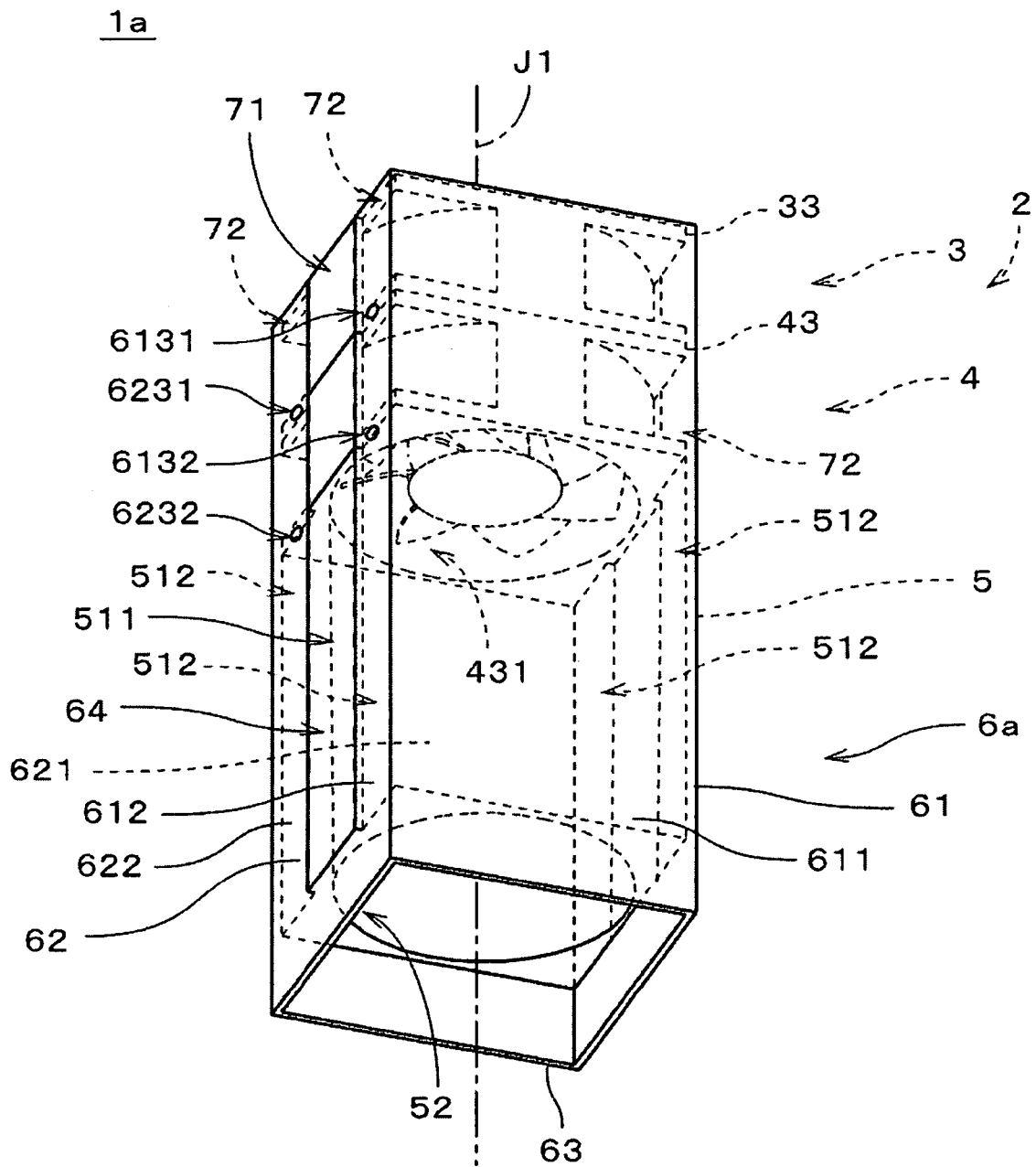
FIG. 12 is a perspective view showing a fan apparatus in another example of the first preferred embodiment of the present invention.

Next, another modification of the first preferred embodiment of the present invention will be described. FIG. 11 is a perspective view of a coupling section 6a in another example of the first preferred embodiment of the present invention. FIG. 12 is a perspective view of a fan apparatus 1a in another example of the first preferred embodiment of the present invention. In FIG. 12, the fan apparatus 1a includes the coupling section 6a shown in FIG. 11. In FIG. 12, the internal structure of the fan apparatus 1a is depicted by dashed lines.

As shown in FIG. 11, the coupling section 6a has a shape in which the first coupling member 61 and the second coupling member 62 of the coupling section 6 shown in FIG. 5 are joined at the ends on the outlet side. In the following description, portions corresponding to the first coupling member 61 and the second coupling member 62 are referred to as a first coupling element 61 and a second coupling element 62, respectively. Other than the coupling section 6a, the configurations of the fan apparatus 1a are the same as those of the fan apparatus 1 shown in FIG. 1. In the following description, the same components as those in the fan apparatus 1 are designated by identical reference numerals.

As shown in FIG. 11, the coupling section 6a includes a first coupling element 61, a second coupling element 62, and an end portion 63. As shown in FIG. 11, the end portion 63 is substantially annular, and is positioned on the outlet side of the coupling section 6a. The end portion 63 has a first flat-plate portion 611, two first bent portions 612, a second flat-plate portion 621, and two second bent portions 622.

The first flat-plate portion 611 and the second flat-plate portion 621 are portions extending in the direction along the center axis J1 in the first coupling element 61 and the second coupling element 62, respectively. On both sides of the first flat-plate portion 611 and the second flat-plate portion 621 in the width direction, the first bent portions 612 and the second bent portions 622 extend toward the second coupling element 62 and the first coupling element 61, respectively. In addition, the first bent portion 612 and the second bent portion 622 are mutually joined on the lower side of the figure. Accordingly, a gap 64 extending substantially parallel to the center axis J1 is defined from an inlet-side end portion to the upper portion of the end portion 63 between the first bent portion 612 and the second bent portion 622.

The coupling section 6a is preferably formed by cutting and bending a single thin plate by press working or the like, and then joining the ends. Accordingly, the coupling section 6a can be easily produced at a low cost.

As shown in FIG. 12, when the axial fan section 2 and the duct section 5 are coupled by the coupling section 6a, the first flat-plate portions 611 of the first coupling element 61 abut against the outer side surface on the front side in the figure. Specifically, the first flat-plate portion 611 abuts against the outer side surface between the two outer side surfaces on which the housing cut-out portions 72 are disposed in the first housing 33 and the second housing 43, and between the two outer side surfaces on which the duct cut-out portions 512 are disposed in the duct section 5. Similarly, the second flat-plate portion 621 of the second coupling element 62 abuts against the outer side surface on the back side in FIG. 12. Specifically, the second flat-plate portion 621 abuts against the other outer side surface between the two outer side surfaces on which the housing cut-out portions 72 are disposed and between the two outer side surfaces on which the duct cut-out portions 512 are disposed.

As shown in FIG. 12, inlet-side portions of the first bent portion 612 and the second bent portion 622 are disposed along the housing cut-out portions 72 (see FIG. 3) excluding the first regions 71 of the first housing 33 and the second housing 43. Outlet-side portions of the first bent portion 612 and the second bent portion 622 are disposed along the duct cut-out portions 512 (see FIG. 4) excluding the first regions 511 of the duct section 5. The end portion 63 of the coupling section 6a is positioned on the lower side (i.e., on the side closer to the outlet) than the lower end portion of the duct section 5.

As shown in FIGS. 11 and 12, in the respective first bent portions 612, two hole portions 6131 and 6132 which are substantially circular are provided. Also, in the respective second bent portions 622, two hole portions 6231 and 6232 which are substantially circular are provided. When the first housing 33, the second housing 43, and the coupling section 6a are combined, the hole portion 6131 of the first bent portion 612 and the hole portion 6231 of the second bent portion 622 are engaged with the substantially circular protrusions defined by combining the protruding portions 334 of the first axial fan 3 with the protruding portions 435 of the second axial fan 4 shown in FIG. 3. Similarly, the hole portion 6132 of the first bent portion 612 and the hole portion 6232 of the second bent portion 622 are engaged with the substantially circular protrusions defined by combining the protruding portions 434 of the second axial fan 4 with the protruding portions 53 of the duct section 5 shown in FIGS. 3 and 4. With this configuration, as shown in FIG. 12, the first housing 33 and the second housing 34 in the axial fan section 2 and the duct section 5 are firmly coupled by the coupling section 6a.

As shown in FIG. 12, when the coupling section 6a is combined with the axial fan section 2 and the duct section 5, the outer side surfaces of the first bent portion 612 and the second bent portion 622 are positioned substantially in the same plane as the surface of the first regions 71 of the first housing 33 and the second housing 43 and the surface of the first region 511 of the duct section 5. As a result, the outer shape of the entire fan apparatus 1 can be made small.

As shown in FIG. 12, in the fan apparatus 1a, similarly to FIG. 9, the distances (the widths) between the housing cut-out portion 72 of the axial fan section 2 and the inner side surfaces 331 and 431 of the first housing 33 and the second housing 43 are equal to or larger than the thickness of the first region 71 of the first housing 33 and the second housing 43. In the fan apparatus 1a, the distance (the width) between the duct cut-out portion 512 and the inner side surface 52 of the duct section 5 is also equal to or larger than the minimum thickness of the first region 511 of the duct section 5. With such a configuration, the inner diameters of the inner side surfaces 331 and 431 of the first housing 33 and the second housing 43 and the inner diameter of the inner side surface 52 of the duct section 52 can be increased without being affected by the coupling section 6a. Accordingly, the airflow path area in the axial fan section 2 and the duct section 5 can be increased. As a result, the air flow and the static pressure of the air exhausted from the fan apparatus 1a can be increased.

As shown in FIG. 12, in the fan apparatus 1a, the outlet-side end portion of the first housing 33, the inlet-side and outlet-side end portions of the second housing 43, and the inlet-side end portion of the duct section 5 are respectively fixed at the four corners. Accordingly, the strong coupling of the first housing 33, the second housing 43, and the duct section 5 can be obtained. As shown in FIGS. 11 and 12, the annular end portion 63 is disposed on the outlet side of the fan apparatus 1a, so that the duct section 5 is firmly held by the coupling section 6a.

Figure 13:
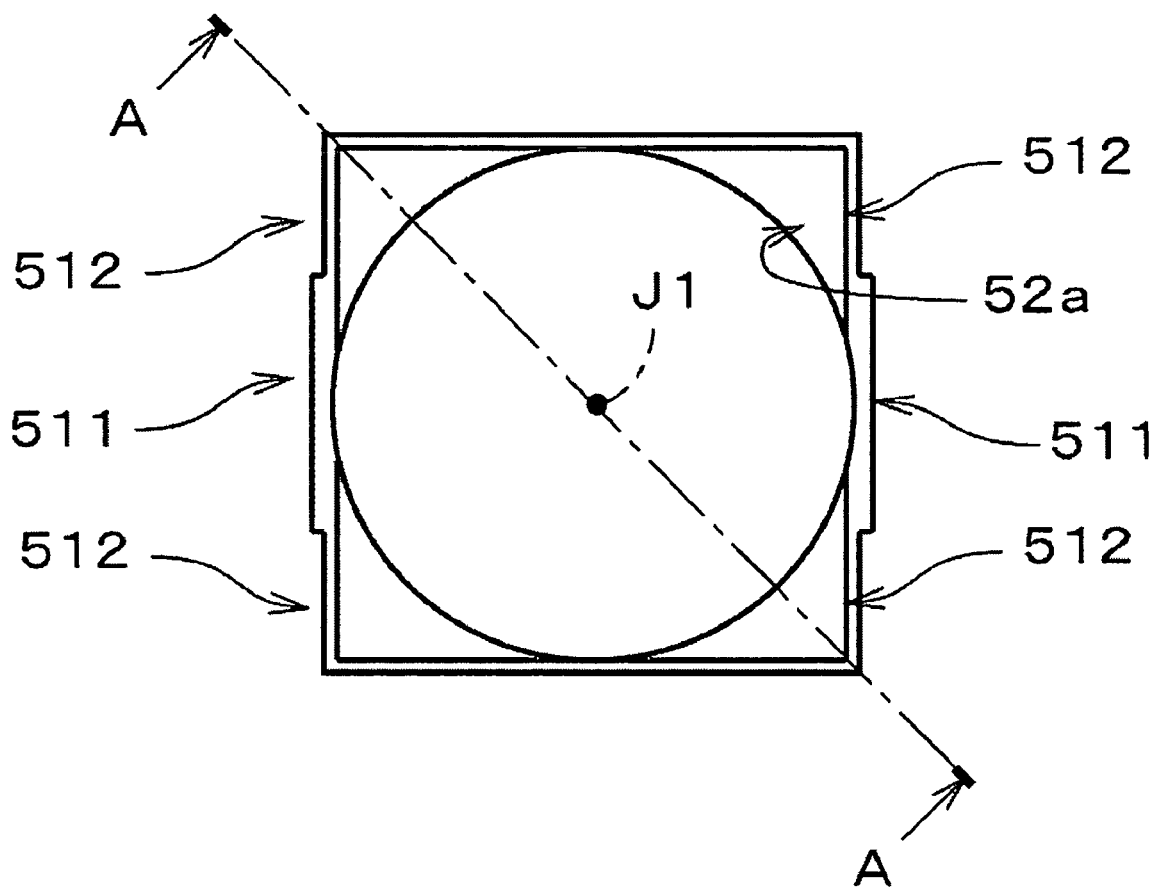
FIG. 13 is a bottom view showing a duct section in another example of the first preferred embodiment of the present invention.
Figure 14:
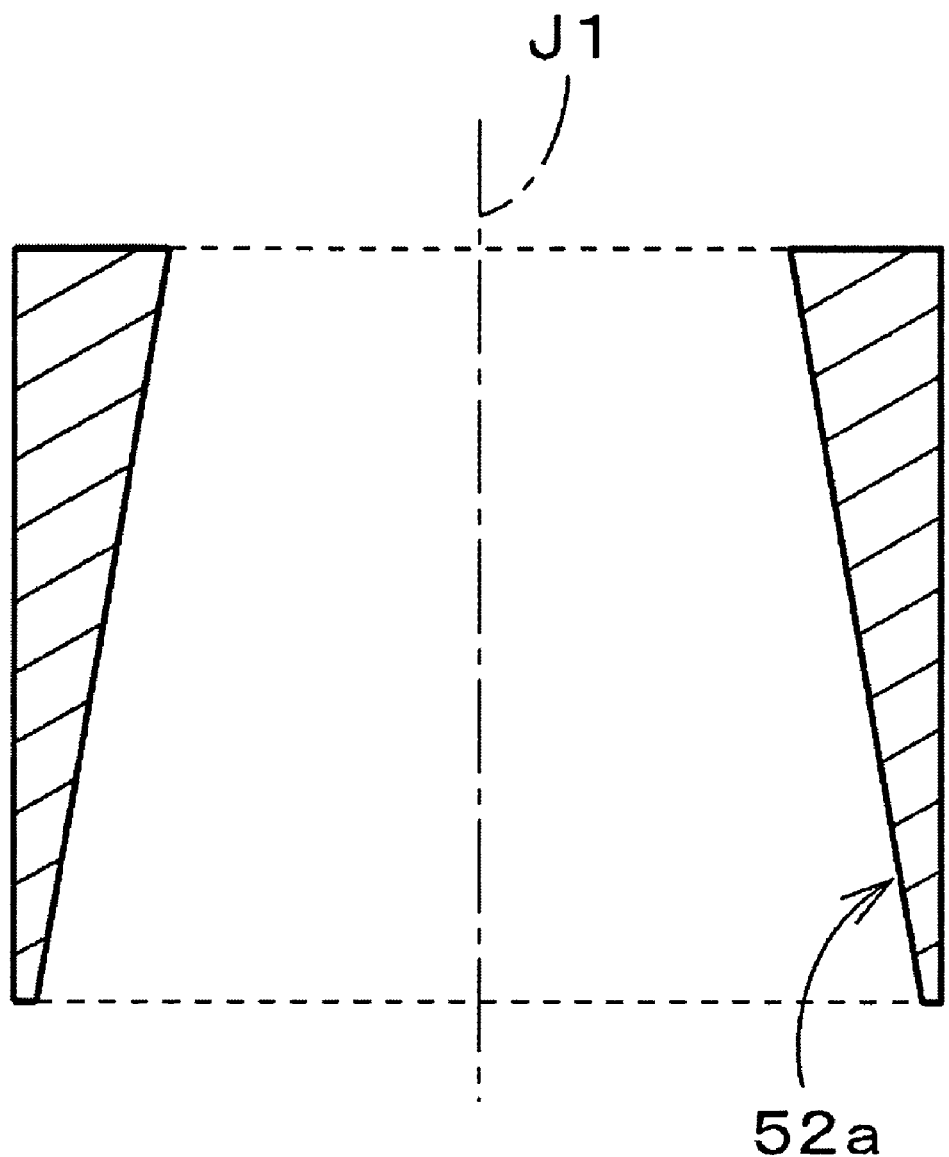
FIG. 14 is a sectional view of the duct section taken along a line indicated by the arrows A-A in FIG. 13.

Next, another modification of the first preferred embodiment of the present invention will be described. FIG. 13 is a bottom view showing a duct section 5a as another example of the first preferred embodiment of the present invention. FIG. 14 is a sectional view of the duct section 5a taken along the line indicated by arrows A-A in FIG. 13. In FIG. 14, the upper side is the inlet side of the duct section 5a, and the lower side is the outlet side thereof. The duct section 5a shown in FIG. 14 is preferably used instead of the duct section 5 of the fan apparatus 1 shown in FIG. 1.

As shown in FIG. 13, the inlet side of an inner side surface 52a of the duct section 5a is substantially circular in the plane. The inner diameter of the inner side surface 52a of the duct section 5a on the inlet side is substantially equal to the inner diameter of the opening of the inner side surface 431 of the second housing 43 (see FIG. 3) on the outlet side.

As shown in FIG. 14, in corner portions of the duct section 5a, the distance between the inner side surface 52a of the duct section 5a and the center axis J1 (i.e., the inner diameter of the inner side surface 52a) is gradually increased toward the outlet side in the axial direction. In other words, the inner side surface 52a of the duct section 5a is a surface extending from the outlet-side opening of the inner side surface 431 of the second housing 43 in the direction along the center axis J1, and gradually expanding radially outwards toward the outlet side in the vicinity of the corner portions of the duct section 5a. In the duct section 5a, the duct cut-out portions 512 exclude the first regions 511 of the duct section 5a.

With the above-described configuration, the air can smoothly flow on the inside of the duct section 5a.

Figure 15:
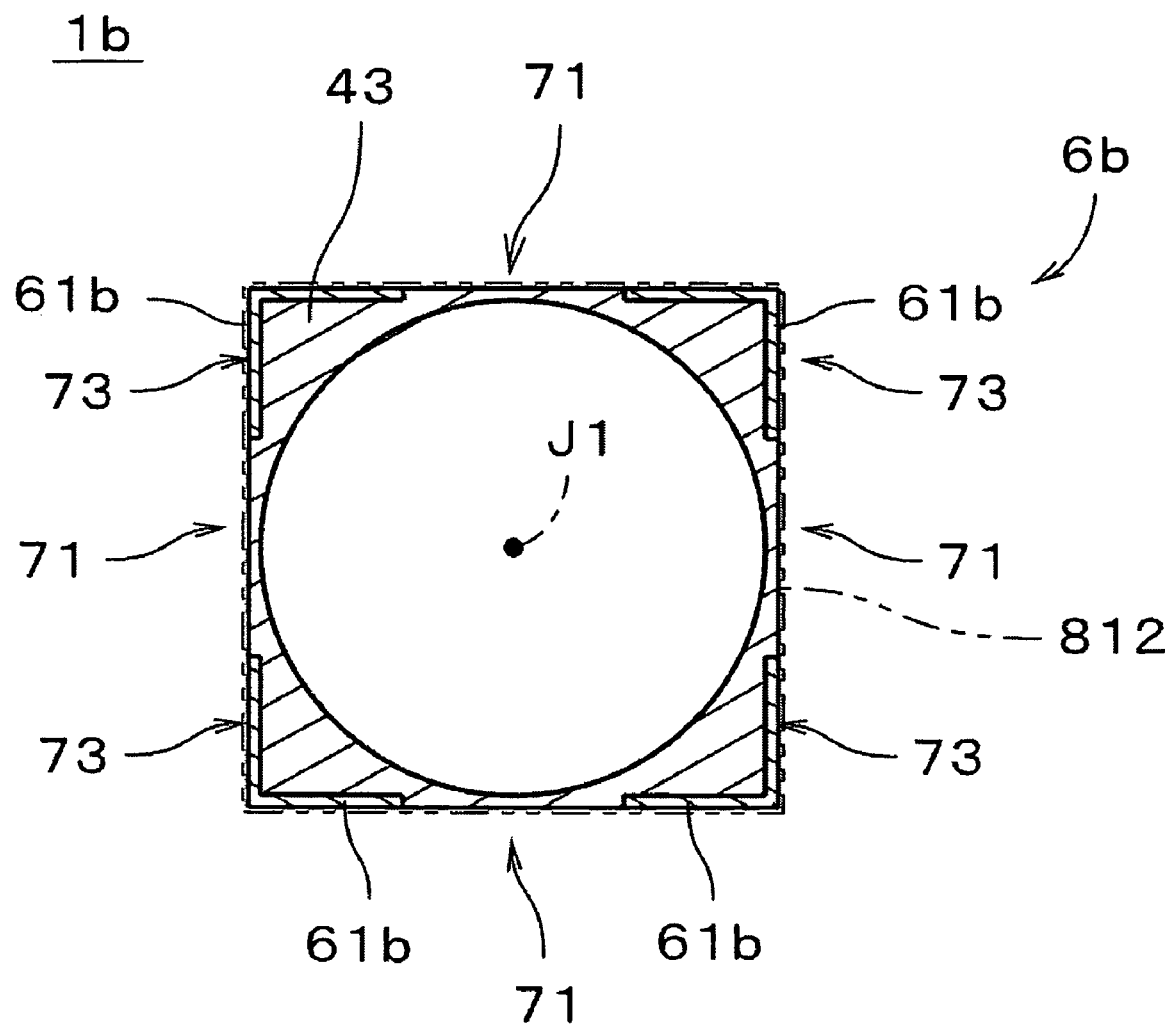
FIG. 15 is a sectional view of a fan apparatus of a second preferred embodiment of the present invention.

Next, a second preferred embodiment of the present invention will be described. FIG. 15 is a sectional view showing a fan apparatus 1b of the second preferred embodiment of the present invention. Similarly to FIG. 6, FIG. 15 shows the sectional view of the fan apparatus 1b taken in the vicinity of the outlet-side end portion of a second axial fan. In the following description, the same components as those in the first preferred embodiment are designated by the identical reference numerals, and the detailed descriptions thereof are omitted.

As shown in FIG. 15, a second housing 43 of a second axial fan 4 has an outer shape which is substantially square when viewed in the direction along the center axis J1. In the four corners of the second housing 43, housing cut-out portions 73 are provided. The respective housing cut-out portions 73 are arranged in positions along the two opposed outer side surfaces in the axial direction excluding first regions 71. In FIG. 15, each housing cut-out portion 73 has a substantially L-shaped section taken along the plane substantially perpendicular to the center axis J1.

In the second preferred embodiment, the outer shape of a first housing 33 is the same as that of the second housing 43. The outer shape of a duct section 5 is a shape obtained by extending the outer shape of the second housing 43 in the direction along the center axis J1. In the first housing 33 and the duct section 5, substantially L-shaped housing cut-out portions 73 and duct cut-outs 512 are provided in the four corners, respectively.

As shown in FIG. 15, a coupling section 6b preferably has four coupling members 61b, for example. Each coupling member 61b has a substantially L-shaped section in a direction substantially perpendicular to the center axis J1 over the entire length thereof in the axial direction. In addition, the coupling members 61b are attached to the first housing 33, the second housing 43, and the duct section 5 in an opposed manner over the entire length thereof in the axial direction along the housing cut-out portions 73 and the duct cut-out portions 512.

As shown in FIG. 15, in the second housing 43, the thickness of the coupling member 61b is substantially equal to the depth of the housing cut-out portion 73. Accordingly, when the coupling member 61b is attached, the outer surface of the coupling member 61b is substantially in the same plane as the surface of the first region 71. As a result, the coupling member 61b does not protrude radially outwards from the externally adjacent square plate 812 (indicated by chain double-dashed line) which is externally adjacent to the second housing 43. The depths of the housing cut-out portion 73 of the first housing 33 and the duct cut-out portion 512 of the duct section 5 are also substantially equal to the thickness of the coupling member 61b. With such a configuration, the outer surface of the coupling member 61b is in the same plane as the surface of the first region 71. As a result, the coupling member 61b is prevented from protruding from the externally adjacent square plate 812 which is externally adjacent to the first housing 33.

In the fan apparatus 1b, the coupling members 61b, the first housing 33, the second housing 43, and the duct section 5 are preferably fixed by screws. It is preferable that screws with heads that will not protrude from the first regions 71 (e.g., flat-head machine screws) be used. Alternatively, the coupling member 61b, the first housing 33, the second housing 43, and the duct section 5 may be fixed by other suitable fixing devices, engaging structures, or engaging methods.

In the present preferred embodiment, the coupling members 61b are attached to the first housing 33 and the second housing 43 excluding the first regions 71 in the fan apparatus 1b. Accordingly, the inner diameters of the inner side surface 331 of the first housing 33, the inner side surface 431 of the second housing 43, and the inner side surface 52 of the duct section 5 can be increased without being affected by the coupling members 61b. As a result, the airflow path area of the first housing 33, the second housing 43, and the duct section 5 is increased. As a result, air flow and static pressure of the air exhausted from the fan apparatus 1b can be increased.

The coupling section 6b couples the axial fan section 2 and the duct section 5 so as to enclose the four corners. Accordingly, the coupling section 6b, the axial fan section 2, and the duct section 5 are mutually and firmly coupled.

Figure 16:
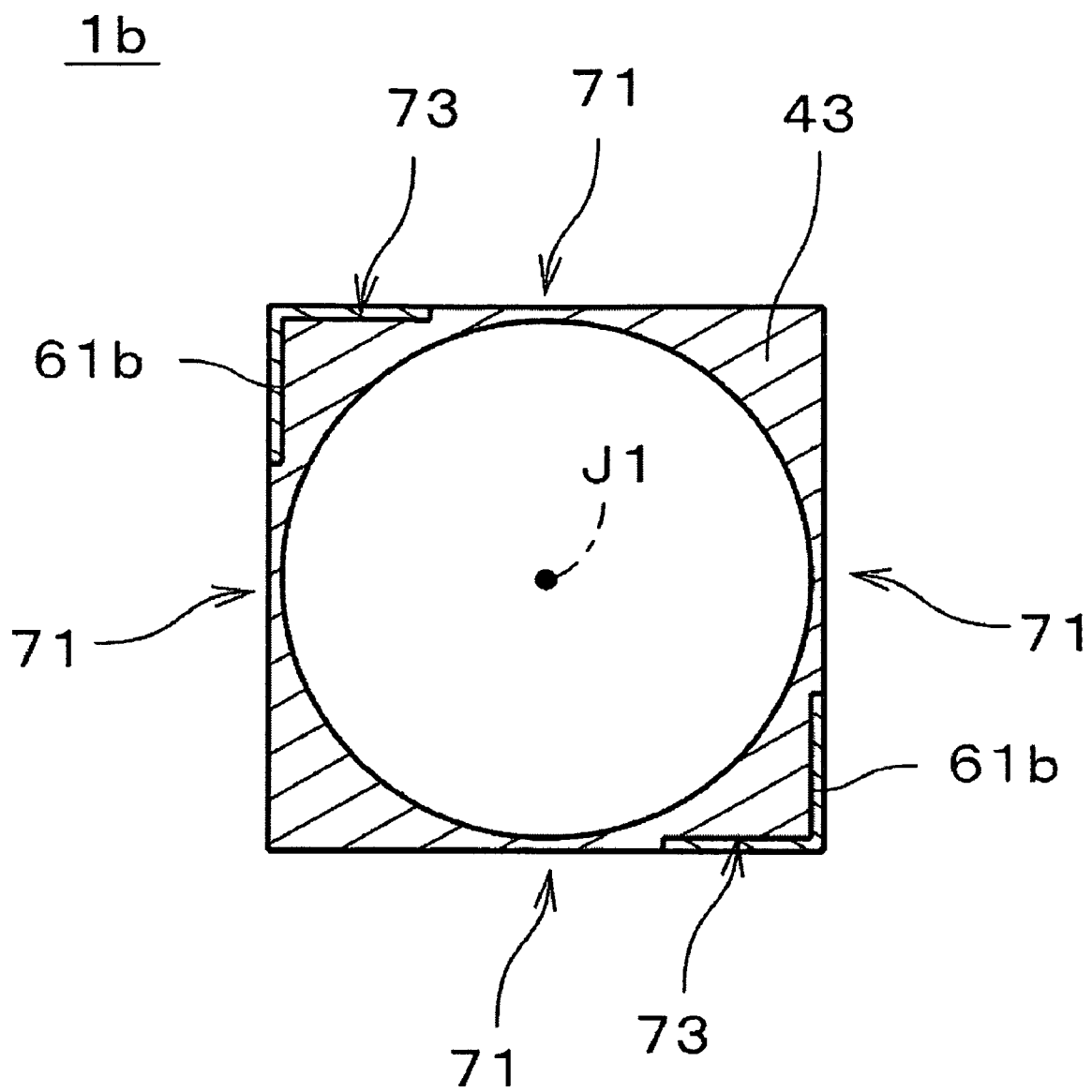
FIG. 16 is a sectional view showing a modified example of the fan apparatus of the second preferred embodiment of the present invention.

Next, a modification of the second preferred embodiment of the present invention will be described. FIG. 16 is a sectional view showing a modification of the fan apparatus 1b of the second preferred embodiment of the present invention.

As shown in FIG. 16, in the second housing 43 of the fan apparatus 1b, housing cut-out portions 73 are only disposed in two diagonally positioned corner portions (i.e., positioned in the upper left portion and in the lower right portion in the figure). Similarly, in the first housing 33 and the duct section 5, the housing cut-out portions 73 and the duct cut-out portions 512 are provided only in the two corner portions which are diagonally positioned.

As shown in FIG. 16, two coupling members 61b are attached in an opposed manner over the entire length of the first housing 33, the second housing 43, and the duct section 5 to the housing cut-out portions 73 and the duct cut-out portions 512. As shown in FIG. 16, the coupling member 61*b* has a substantially L-shaped section in a direction substantially perpendicular to the center axis J1.

As shown in FIG. 16, in the case where the two housing cut-out portions 73 are disposed in the diagonal direction, the housing cut-out portions 73 and the duct cut-out portions 512 are defined in the first housing 33, the second housing 43, and the duct section 5 excluding the first regions 71 and 511. As a result, similarly to the other preferred embodiments and modifications, the axial fan section 2 and the duct section 5 can be firmly coupled by the two coupling members 61*b*.

Figure 17:
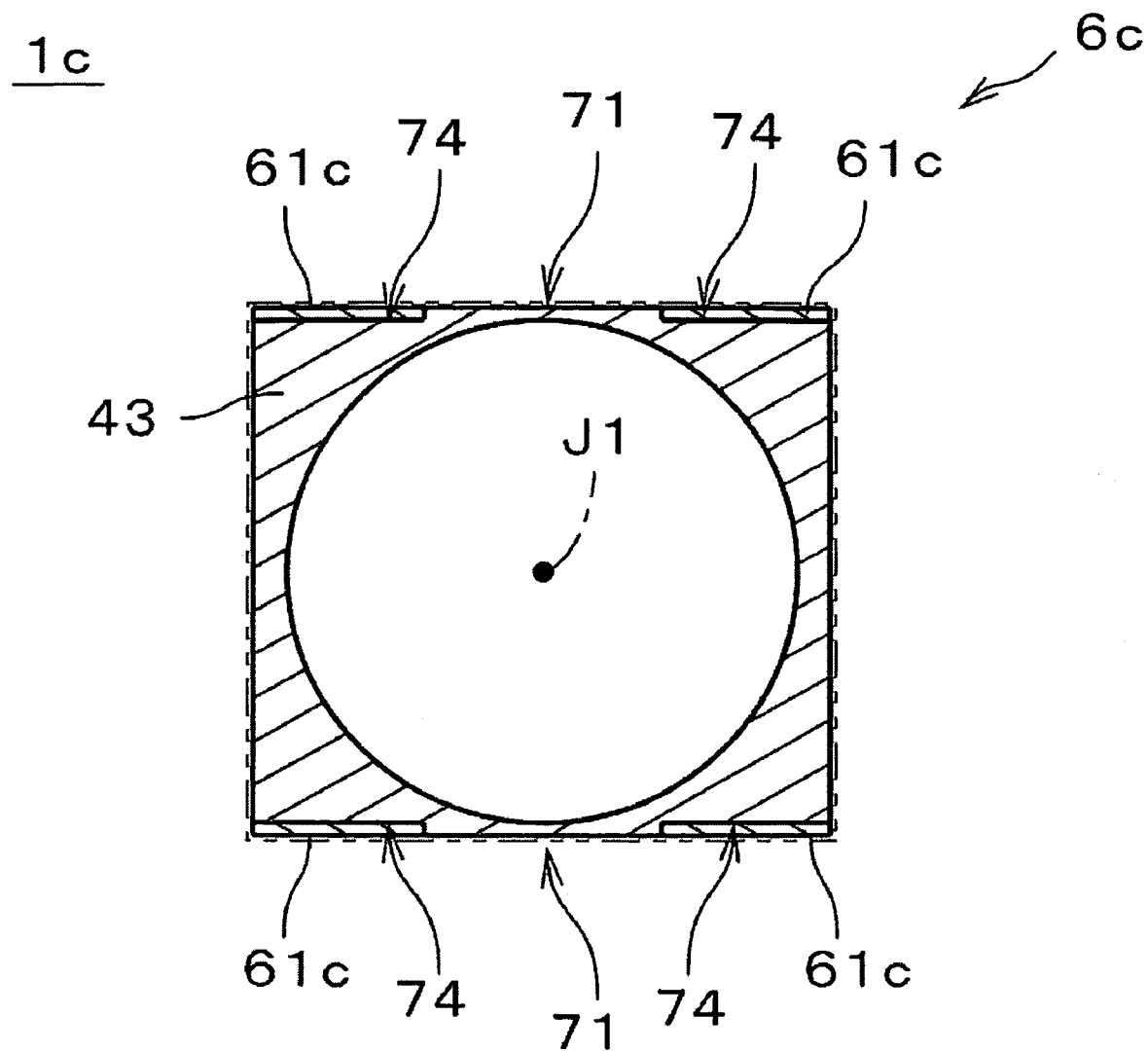
FIG. 17 is a sectional view of a fan apparatus of a third preferred embodiment of the present invention.

Next, a third preferred embodiment of the present invention will be described. FIG. 17 is a sectional view showing a fan apparatus 1*c* of the third preferred embodiment of the present invention. In more detail, FIG. 17 is a sectional view of the fan apparatus 1*c* taken in the vicinity of the outlet-side end portion of the second axial fan 4.

As shown in FIG. 17, the fan apparatus 1*c* includes a coupling section 6*c*. The coupling section 6*c* is different from the coupling sections in the other preferred embodiments and modifications (e.g., the coupling section 6 shown in FIG. 4 or the like) in that the coupling section 6*c* includes only four thin-plate coupling members 61*c*. Specifically, in the coupling section 6*c*, the first flat-plate portion 611 and the second flat-plate portion 621 are omitted from the first coupling member 61 and the second coupling member 62, respectively.

As shown in FIG. 17, in the outer side surface of the second housing 43 on the upper side and the lower side of FIG. 17, two housing cut-out portions 74 are provided, respectively. The housing cut-out portions 74 are positioned on both sides of the outer side surface of the second housing 43 in the width direction excluding the first regions 71, and the housing cut-out portions 74 extend in the direction substantially parallel to the center axis J1. Similarly, in the first housing 33 and the duct section 5, in the portions corresponding to the housing cut-out portions 74 of the second housing 43, housing cut-out portions 74 and duct cut-out portions 512 are provided, respectively.

In FIG. 17, the coupling members 61*c* are opposed to the first housing 33, the second housing 43, and the duct section 5 over the entire length thereof, and the coupling members 61*c* are attached to the first housing 33, the second housing 43, and the duct section 5 along the housing cut-out portions 74 and the duct cut-out portions 512.

As shown in FIG. 17, the thickness of the coupling member 61*c* is substantially equal to the depth of the housing cut-out portion 74. With this configuration, when the coupling member 61*c* is attached to the housing cut-out portion 74, the outer surface of the coupling member 61*c* and the surface of the first region 71 are in the same plane. As a result, it is possible to prevent the coupling member 61*c* from protruding from the externally adjacent square plate 812 which is externally adjacent to the second housing 43. Similarly, the thickness of the coupling member 61*c* is preferably equal to the depth of the duct cut-out portion 512. With this configuration, when the coupling member 61*c* is attached to the duct cut-out portion 512, the outer surface of the coupling member 61*c* and the surface of the first region 511 are in the same plane. As a result, the coupling member 61*c* does not protrude from the externally adjacent square plate 812. Similarly to the other preferred embodiments and modifications, in the fan apparatus 1*c*, the coupling members 61*c*, the first housing 33, the second housing 43, and the duct section 5 are fixed by screws, for example.

As described above, in this preferred embodiment, similarly to the other preferred embodiments, the housing cut-out portions 74 and the duct cut-out portions 512 are defined excluding the first regions 71 of the first housing 33 and the second housing and the first region 511 of the duct section 5. Accordingly, without being affected by the coupling members 61*c*, the inner diameters of the inner side surface 331 of the first housing 33, the inner side surface 431 of the second housing 43, and the inner side surface 52 of the duct section 5 can be increased. Accordingly, an airflow path area of the first housing 33, the second housing 43, and the duct section 5 can be increased. As a result, the air flow and the static pressure of the fan apparatus 1*c* can be increased.

The coupling members 61*c* couple the axial fan section 2 and the duct section 5 in the four corners. Accordingly, the axial fan section 2, the duct section 5, and the coupling members 61*c* are mutually and firmly coupled.

Figure 18:
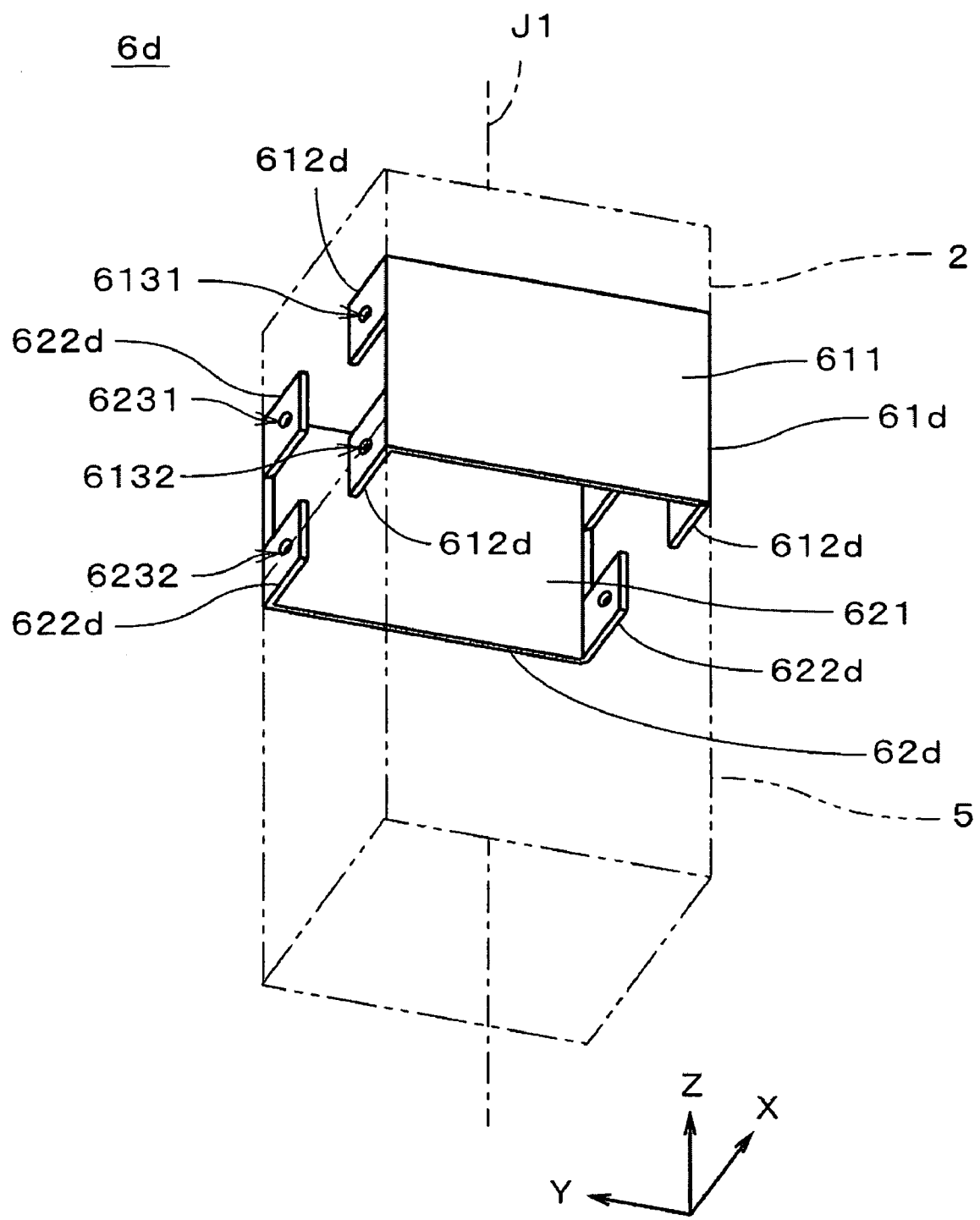
FIG. 18 is a perspective view showing a coupling section in a fourth preferred embodiment of the present invention.

Next, a fourth preferred embodiment of the present invention will be described. FIG. 18 is a perspective view of a coupling section 6*d* in the fourth preferred embodiment of the present invention. In FIG. 18, general shapes of the axial fan section 2 and the duct section 5 to which the coupling section 6*d* is attached are depicted by a chain double-dashed line.

As shown in FIG. 18, the coupling section 6*d* includes a first coupling member 61*d* and a second coupling member 62*d*.

The first coupling member 61*d* includes a first flat-plate portion 611 and four first bent portions 612*d*. The first flat-plate portion 611 is substantially parallel to the center axis J1. The first bent portions 612*d* are provided on the inlet side and on the outlet side of the first flat-plate portion 611, respectively, and on both sides of the first flat-plate portion 611 in the width direction which is substantially perpendicular to the center axis J1 (i.e., on the left side and on the right side in the figure). In addition, the respective first bent portions 612*d* are bent at a substantially right angle from the first flat-plate portion 61 toward the second coupling member 62*d*.

On the other hand, the second coupling member 62*d* includes a second flat-plate portion 621, and preferably four second bent portions 622*d*. The second flat-plate portion 621 is positioned substantially parallel to the direction along the center axis J1, and is opposed to the first flat-plate portion 611 of the first coupling member 61*d* with the center axis J1 interposed therebetween. The second bent portions 622*d* are defined on the inlet side and on the outlet side, respectively, and on both sides of the second flat-plate portion 621 in the width direction (i.e., on the left side and on the right side in the figure). The second bent portions 622*d* are bent at a substantially right angle with respect to the second flat-plate portion 621 toward the first bent portions 612*d*.

As shown on the left side of FIG. 18, in the two first bent portions 612*d*, substantially circular hole portions 6131 and 6132 are provided, respectively. Similarly, in the two second bent portions 622*d*, substantially circular hole portions 6231 and 6232 are provided, respectively.

The hole portion 6131 in the first bent portion 612*d* and the hole portion 6231 in the second bent portion 622*d* are engaged with substantially circular protrusions defined by combining the protruding portions 334 of the first axial fan 3 and the protruding portions 435 of the second axial fan 4, respectively. Similarly, the hole portion 6132 of the first bent portion 612*d* and the hole portion 6232 of the second bent portion 622*d* are engaged with substantially circular protrusions defined by combining the protruding portions 434 of the second axial fan 4 and the protruding portions 53 of the duct section 5, respectively. With such a configuration, the first housing 33 and the second housing 43 of the axial fan section 2 and the duct section 5 are firmly coupled by the coupling section 6*d*.

Figure 19:
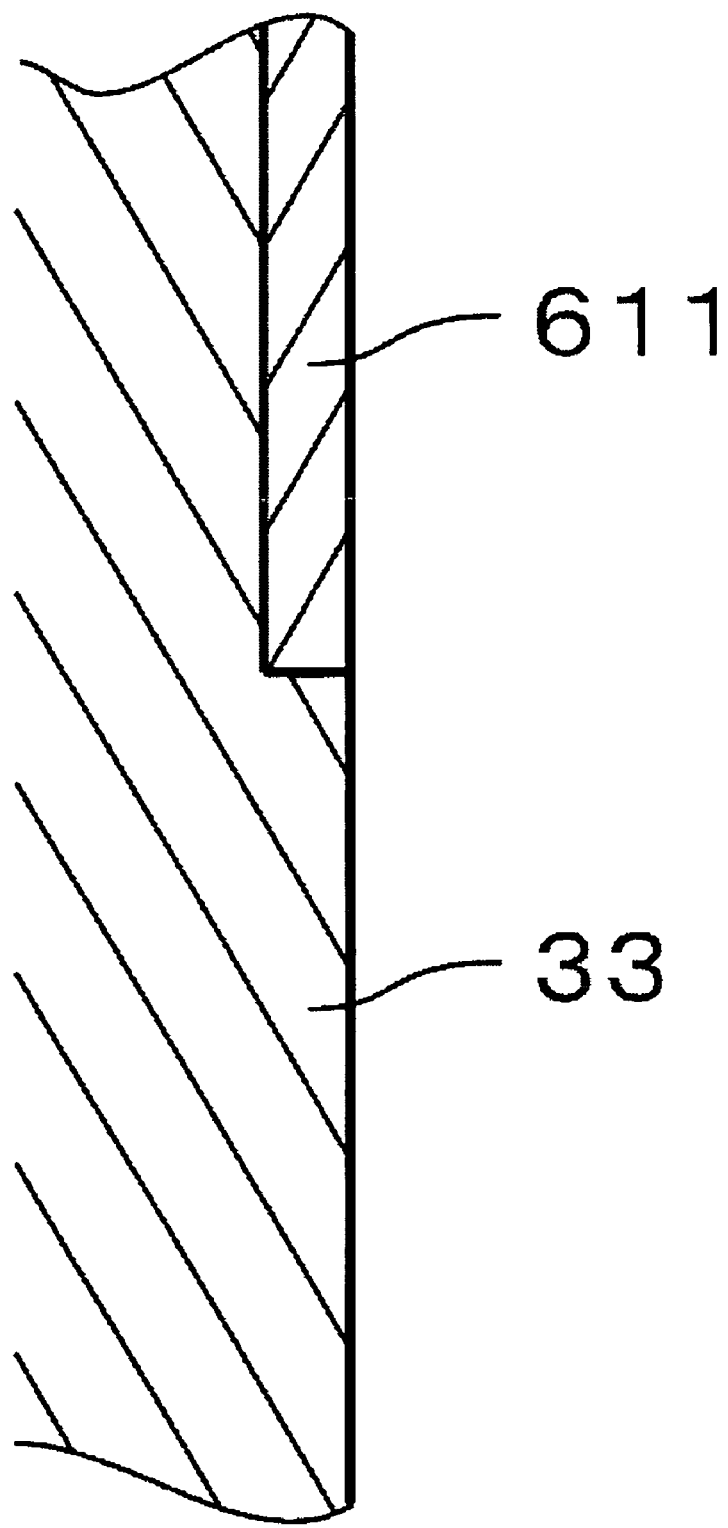
FIG. 19 is a view showing a portion of a section in a boundary portion between a first coupling member and a first housing in the fourth preferred embodiment of the present invention.

FIG. 19 is a view showing a portion of a section in a boundary portion between the first coupling member 61d and the first housing 33 in the fourth preferred embodiment of the present invention. In more detail, FIG. 19 shows the sectional view of a portion of the boundary portion between an inlet-side portion of the first flat-plate portion 611 of the first coupling member 61d and the first housing 33 of the first axial fan 3 taken along a plane which is substantially parallel to the Z-X plate in FIG. 18 and includes the hole portion 6131.

Figure 20:
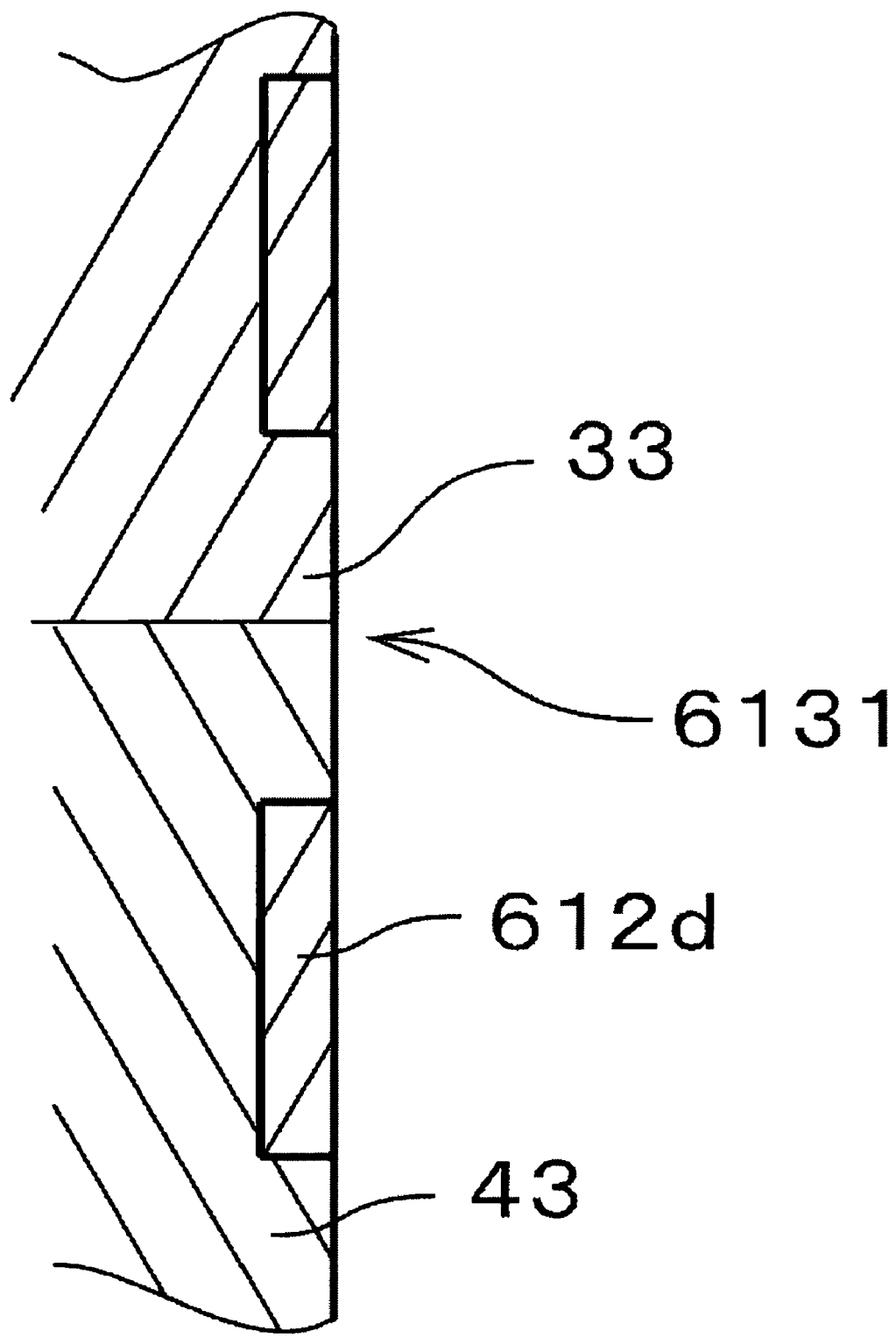
FIG. 20 is a sectional view showing a boundary portion between a first bent portion on the inlet side of the first coupling member, and the first housing and the second housing in the fourth preferred embodiment of the present invention.

FIG. 20 is a sectional view showing a boundary portion between the first bent portion 612d on the inlet side of the first coupling member 61d and the first housing 33 and the second housing 43 in the fourth preferred embodiment of the present invention. In more detail, FIG. 20 shows the sectional view of a portion of the boundary portion between the first bent portion 612d on the upper side of the first coupling member 61d shown in FIG. 18 and the first and second housings 33 and 43 of the first and second axial fans, taken along a plane which is substantially parallel to the Y-Z plane in FIG. 18 and includes the hole portion 6131.

In FIG. 20, in the first housing 33 and the second housing 43 of the axial fan section 2, resin or plastic (a portion of the first housing 33 and the second housing 43) exists in a portion between the two first bent portions 612d which are axially arranged. As shown in FIG. 19, in the first housing 33, a cut-out portion having the same volume as that obtained by the width and the thickness of the first flat-plate portion 611 is provided. With this configuration, the surface of the first housing 33 and the outer surface of the first flat-plate portion 611 are in substantially the same plane. In the outer side surface of the duct section 5, a cut-out portion having the same volume as that obtained by the width and the thickness of the first flat-plate portion 611 is also provided. With this configuration, the surface of the duct section 5 and the outer surface of the first flat-plate portion 611 are also in substantially the same plane. The second flat-plate portion 621, and the first housing 33 and the duct section 5 have the same relationship as described above.

As described above, in FIG. 20, in the outer side surfaces of the first housing 33 and the second housing 43, the portions corresponding to the first bent portions 612 are cut out. Thus, the first bent portions 612d are attached to the first housing 33 and the second housing 43. At this time, the outer surface of the first bent portion 612d and the surfaces of the first housing 33 and the second housing 43 are substantially in the same plane. In FIG. 18, in the first bent portion 612d on the lower side, and the second housing 43 and the duct section 5, the surface of the first bent portion 612d is in substantially the same plane as the surfaces of the second housing 43 and the duct section 5. The second coupling member 62d, and the housings 33 and 34 and the duct section 5 have the same relationship.

As described above, the coupling member 6d includes only the minimum required portions for coupling, as compared with the coupling member 6 shown in FIG. 5. Accordingly, in the coupling member 6d shown in FIG. 18, the coupling member 6d can be attached excluding the first regions 71 of the first housing 33 and the second housing 43 and the first region 511 of the duct section 5. As a result, similarly to the other preferred embodiments and modifications, a wide air flow path area of the axial fan section 2 and the duct section 5 can be ensured.

Figure 21:
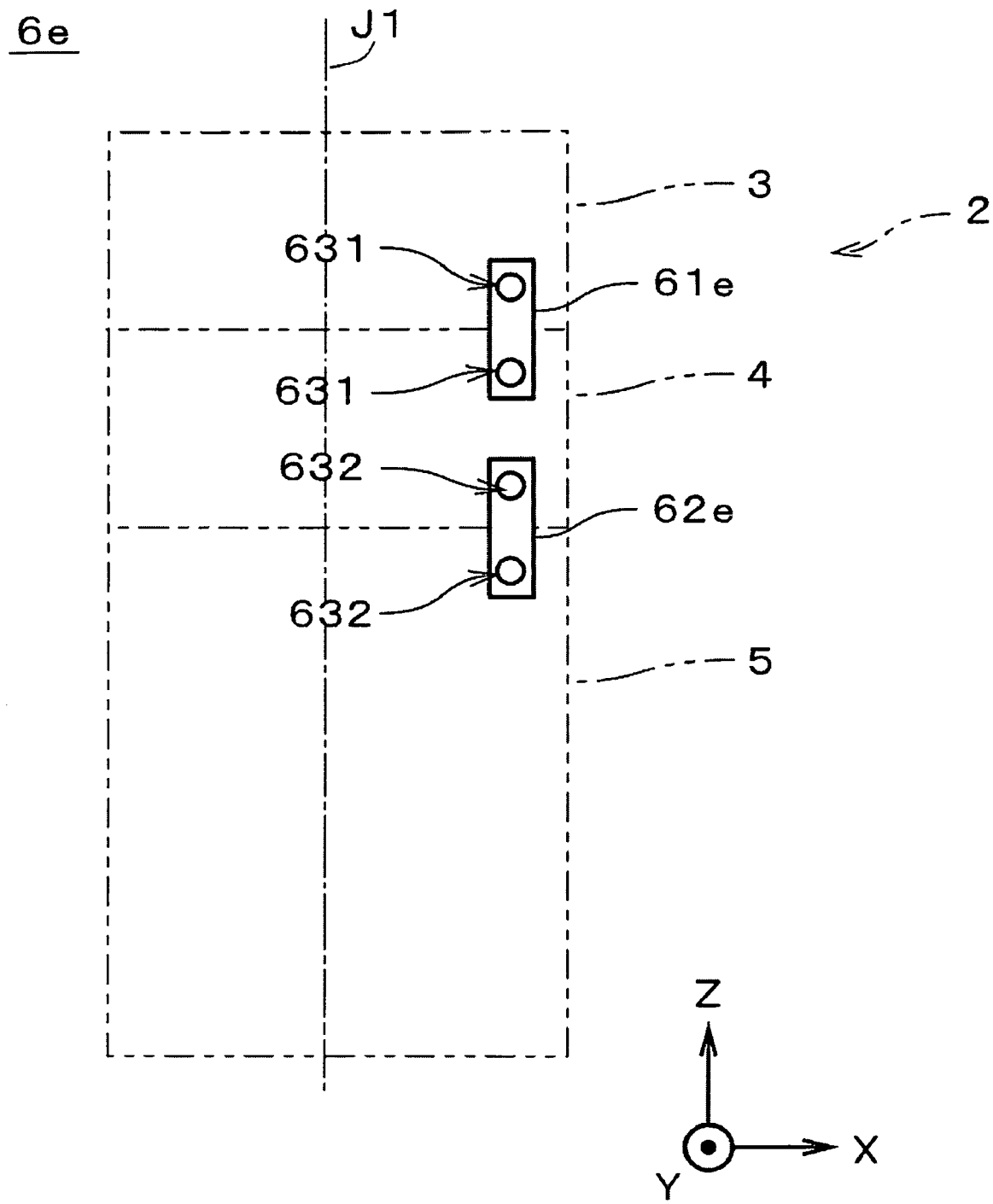
FIG. 21 is a view showing a coupling section of a fan apparatus of a fifth preferred embodiment of the present invention.

Next, a fifth preferred embodiment of the present invention will be described. FIG. 21 is a view of a coupling section 6e in a fan apparatus 1d of the fifth preferred embodiment of the present invention. In FIG. 21, general shapes of the first and second axial fans 3 and 4 (i.e., the axial fan section 2) and the duct section 5 which are coupled by the coupling section 6e are depicted by chain double-dashed lines.

As shown in FIG. 21, the coupling section 6e includes a first coupling member 61e and a second coupling member 62e. The first coupling member 61e and the second coupling member 62e are thin plates, and are arranged along the Z-direction in FIG. 21 (in the direction substantially parallel to the center axis J1). The first coupling member 61e and the second coupling member 62e are also disposed on an outer side surface on the opposite side to the outer side surface shown in FIG. 21 in the same way.

The first coupling member 61e couples the first housing 33 of the first axial fan 3 and the second housing 43 of the second axial fan 4 by two screws 631, for example. Similarly, the second coupling member 62e couples the second housing 43 of the second axial fan 4 and the duct section 5 by two screws 632, for example. As for the screws 631 and 632, desirably, the head portions thereof do not protrude from the coupling section 6e. The coupling of the first housing 33 and the second housing 43 by the coupling member 61e, and the coupling of the second housing 43 and the duct section 5 by the second coupling member 62e are not necessarily performed by screws. Alternatively, other fixing devices or engaging structures may be used.

Figure 22:
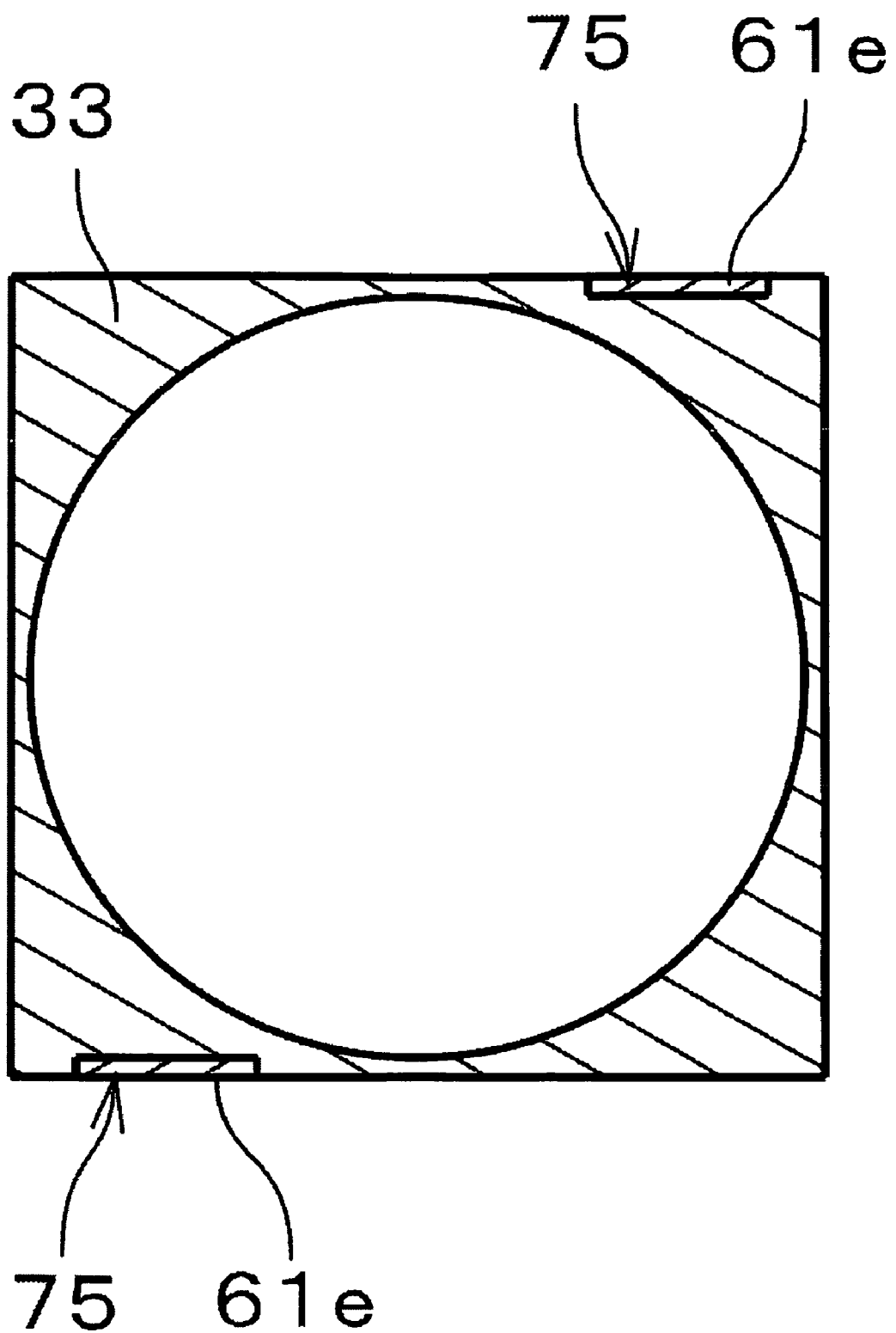
FIG. 22 is a sectional view of a first coupling member and a first housing shown in FIG. 21.

FIG. 22 is a sectional view of the first coupling member 61e and the first housing 33 shown in FIG. 21. FIG. 22 is a sectional view of the first coupling member 61e and the first housing 33 of the first axial fan 3 shown in FIG. 21 taken along a plane which is parallel to the X-Y plane in FIG. 21 excluding the screw portions.

As shown in FIG. 22, in the first housing 33, two housing cut-out portions 75 are disposed in the positions corresponding to the first coupling members 61e. The two first coupling members 61e and the two housing cut-out portions 75 are positioned in the vicinity of the two corners which are diagonally positioned in the first housing 33, respectively.

As shown in FIG. 22, the depth of the housing cut-out portion 75 is substantially equal to the thickness of the first coupling member 61e. When the first coupling member 61e is attached to the housing cut-out portion 75, the outer surface of the first coupling member 61e and the surface of the first housing 33 are substantially in the same plane.

In the second housing 43 of the second axial fan 4 (see FIG. 21), housing cut-out portions 75 are disposed in the positions corresponding to the first coupling members 61e. Between the second coupling member 62e and the second housing 43, and between the second coupling member 62e and the duct section 5, a housing cut-out portion 75 and a duct cut-out portion 512 are provided, respectively. The second coupling members 62e are attached so that the surface of the second coupling members 62e are substantially in the same plane as the surfaces of the second housing 43 and the duct section 5.

In the coupling section 6e shown in FIG. 21, the axial fan section 2 and the duct section 5 can be coupled excluding the first regions 71 of the first housing 33 and the second housing 43 and the first region 511 of the duct section 5. Accordingly, a wide airflow path area of the axial fan section 2 and the duct section 5 can be ensured, without being affected by the coupling section 6e.

As described above, in the present preferred embodiment, the first coupling members 61e and the second coupling members 62e are disposed in the two corner portions in the diagonal direction, respectively. Accordingly, the structure coupling the first and second axial fans 3 and 4 and the duct section 5 can include the minimum required elements to obtain a stable coupling.

The present invention has been described above by way of the preferred embodiments and the modifications. However, the present invention is not limited to the above-described preferred embodiments and the modifications, but may be variously changed.

For example, in the structures shown in FIGS. 16 and 22, the housing cut-out portions and the duct cut-out portions to which the coupling section is attached are preferably disposed at least in the vicinity of two corner portions which are positioned in the diagonal direction. With such a configuration, the first and second axial fans 3 and 4 and the duct section 5 can be stably coupled. Alternatively, the positions in which the cut-out portions are defined may be in the vicinity of three corner portions, and the positions may not be specifically limited.

In the structures shown in FIGS. 6 and 17, the housing cut-out portions are disposed along the two outer side surfaces. In FIG. 15, the housing cut-out portions are disposed along the four outer side surfaces. Alternatively, the housing cut-out portion may be defined only in one outer side surface in which the thickness of the first region is the smallest. That is, the housing cut-out portion may be disposed in at least only one outer surface in which the minimum thickness of the first region is the smallest among the four outer surfaces. Similarly, the duct cut-out portion may be defined in at least one outer side surface in which the minimum thickness of the first region is the smallest among the four outer side surfaces of the duct section.

In the case where a portion of the coupling section is attached to the axial fan section 2, and the other portion of the coupling section is attached to the duct section, other shapes of housing cut-out portions and duct cut-out portions may be used, and the shapes are not specifically limited. For example, the housing cut-out portion and the duct cut-out portion may be disposed so as to be larger than the coupling section. Alternatively, the cut-out portion may be defined deeper, and the thickness of the coupling member may be greatly larger than the thickness of the first regions of the housing and the duct section.

In the above-described preferred embodiments and the modifications, the second axial fan 4 in the axial fan section 2 has the structure which is vertically inverted from that of the first axial fan 3. However, the vertical relationships between the rotor portion and the stator portion in the first axial fan 3 and the second axial fan 4 may be the same. Alternatively, the second impeller 42 may rotate in the same direction as the first impeller 32 around the center axis J1. In addition, the axial fan section 2 may be a single axial fan. In such a case, the housing cut-out portion is disposed at least in the end portion of the housing on the outlet side.

The fan apparatuses according to the above-described preferred embodiments may be applied for cooling electronic components, or may be used as fan apparatuses for other purposes such as a fan apparatus for sending air to an object other than electronic equipment. The applications of the fan apparatuses according to the present invention will not be specifically limited.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A fan apparatus comprising:
   a fan section having a hollow housing with an inlet and an outlet;
   a hollow duct section connected to the outlet of the fan section; and
   a coupling section arranged to couple the housing of the fan section and the duct section, wherein the housing includes a first region and a plurality of housing cut-out portions arranged in portions other than the first region, and the coupling section is arranged to couple the duct section via the housing cut-out portions.

2. A fan apparatus according to claim 1, wherein the first region includes a thickness between an inner surface of the housing and an outer surface of the housing that is smallest when compared to distances between the inner surface of the housing and the outer surface of the housing at other regions.

3. A fan apparatus according to claim 2, wherein the housing is made from resin or plastic, and a thickness of the first region of the housing is between about 0.7 mm and about 2.5 mm.

4. A fan apparatus according to claim 1, wherein an outer surface of the coupling section is in substantially the same plane as the outer surface of the housing.

5. A fan apparatus according to claim 4, wherein a thickness between the housing cut-out portion and the inner surface of the housing is equal to or larger than the thickness of the first region of the housing.

6. A fan apparatus according to claim 1, wherein the housing cut-out portions are mutually opposed to one another.

7. A fan apparatus according to claim 6, wherein the housing cut-out portions are defined in a mutually opposed manner with the first region interposed therebetween.

8. A fan apparatus according to claim 1, wherein the housing has a substantially square-shaped tubular outer shape.

9. A fan apparatus according to claim 1, wherein the fan section includes a plurality of axial fans.

10. A fan apparatus according to claim 1, wherein an outer shape of the duct section is substantially similar to an outer shape of the housing.

11. A fan apparatus according to claim 1, wherein an inner surface of the duct section is substantially cylindrical.

12. A fan apparatus according to claim 1, wherein the duct section has an inlet and an outlet, and an inner diameter of an inner surface of the duct section increases from the inlet toward the outlet.

13. A fan apparatus according to claim 1, wherein the duct section has a first region in which a thickness between an inner surface of the duct section and an outer surface of the duct section is smallest when compared to distances between the inner surface of the duct section and the outer surface of the duct section at other regions.

14. A fan apparatus according to claim 13, further comprising at least one duct cut-out portion arranged in a portion other than the first region of the duct section, and the coupling section couples the housing and the coupling section via the duct cut-out portion of the duct section.

15. A fan apparatus according to claim 14, wherein an outer surface of the coupling section is in substantially the same plane as the outer surface of the duct section.

16. A fan apparatus according to claim 15, wherein a thickness between the duct cut-out portion and the inner surface of the duct section is equal to or larger than the thickness of the first region of the duct section.

17. A fan apparatus according to claim 1, wherein the coupling section has a plate shape.

18. A fan apparatus according to claim 1, wherein the coupling section has a first coupling member and a second coupling member, and at least a portion of the first coupling member and at least a portion of the second coupling member are opposed to the housing and the duct section.

19. A fan apparatus according to claim 18, wherein the first coupling member and the second coupling member are mutually opposed to each other.

* * * * *